US012581191B2

(12) United States Patent (10) Patent No.: US 12,581,191 B2

Okamori et al. (45) Date of Patent: Mar. 17, 2026

(54) OPTICAL VIBRATION-PROOF DEVICE, OPTICAL DEVICE, AND FIXING METHOD OF MAGNETIC SENSOR

(71) Applicant: FUJIFILM Corporation, Tokyo (JP)

(72) Inventors: Kazuaki Okamori, Saitama (JP); Atsushi Misawa, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 604 days.

(21) Appl. No.: 17/812,073

(22) Filed: Jul. 12, 2022

(65) Prior Publication Data

US 2022/0353418 A1 Nov. 3, 2022

Related U.S. Application Data

(63) Continuation of application No. PCT/JP2021/001558, filed on Jan. 19, 2021.

(30) Foreign Application Priority Data

Jan. 22, 2020 (JP) ................................. 2020-008232

(51) Int. Cl.
H04N 23/68 (2023.01)
G02B 7/08 (2021.01)
(Continued)

(52) U.S. Cl.
CPC ............. H04N 23/687 (2023.01); G02B 7/08 (2013.01); H04N 23/54 (2023.01); H04N 23/55 (2023.01); G01R 33/07 (2013.01)

(58) Field of Classification Search
CPC ...... H04N 23/54; H04N 23/687; G01R 33/06; G01R 33/07; G01R 33/09; G01R 33/072; G01R 33/091; G02B 27/646; G02B 5/00
See application file for complete search history.

(56) References Cited

U.S. PATENT DOCUMENTS

2007/0297055 A1* 12/2007 Enomoto ........... H04N 23/6812
359/554
2011/0181740 A1* 7/2011 Watanabe .............. G03B 13/36
348/E5.031
(Continued)

FOREIGN PATENT DOCUMENTS

CN 104898348 A 9/2015
CN 109073855 A 12/2018
(Continued)

OTHER PUBLICATIONS

An Office Action mailed by China National Intellectual Property Administration on Sep. 15, 2023, which corresponds to Chinese Patent Application No. 202180010668.2 and is related to U.S. Appl. No. 17/812,073; with English language translation.
(Continued)

*Primary Examiner* — Bumsuk Won
*Assistant Examiner* — Alex Park Rickel
(74) *Attorney, Agent, or Firm* — Studebaker Brackett PLLC

(57) ABSTRACT

Optical vibration-proof device, optical device, and fixing method for attaching a magnetic sensor that detects a position of a lens for shake correction to a base member. An optical vibration-proof device including a base member, a lens holding frame configured to be movable, a magnetic material that is moved integrally with the lens holding frame and generates a magnetic field, a position detection hall element that detects a change in the magnetic field in accordance with movement of the lens holding frame, and a sensor attachment member fixed to the base member. The base member includes a positioning part. The sensor attachment member brings the position detection hall element into contact with the positioning part to position the position detection hall element. The base member is formed integrally with the positioning part as a same member and is (Continued)

formed as a separate member from the sensor attachment member.

19 Claims, 18 Drawing Sheets

(51) Int. Cl.

| | |
|---|---|
| *H04N 23/54* | (2023.01) |
| *H04N 23/55* | (2023.01) |
| *G01R 33/07* | (2006.01) |

(56) References Cited

U.S. PATENT DOCUMENTS

| | | | |
|---|---|---|---|
| 2015/0215542 A1* | 7/2015 | Nomura ................. | H04N 23/55 348/208.11 |
| 2018/0203203 A1* | 7/2018 | Lee ........................ | H04N 23/55 |
| 2019/0064475 A1 | 2/2019 | Kobayashi | |

FOREIGN PATENT DOCUMENTS

| | | | | |
|---|---|---|---|---|
| CN | 109975942 A | * | 7/2019 | ........... G02B 27/646 |
| JP | 2007-057605 A | | 3/2007 | |
| JP | 2009-151063 A | | 7/2009 | |
| JP | 2013-231924 A | | 11/2013 | |
| JP | 2015-064547 A | | 4/2015 | |
| JP | 2016157040 A | * | 9/2016 | |
| JP | 2016-186587 A | | 10/2016 | |

OTHER PUBLICATIONS

International Search Report issued in PCT/JP2021/001558; mailed Apr. 6, 2021.
International Preliminary Report on Patentability and Written Opinion issued in PCT/JP2021/001558; issued Jul. 26, 2022.

* cited by examiner

230

245(246)

224

135(136)

120

134A(134B)

134

134C

222

S

N

240

242  242A  134A(134B)

134

230

120          224          134C

OPTICAL VIBRATION-PROOF DEVICE, OPTICAL DEVICE, AND FIXING METHOD OF MAGNETIC SENSOR

CROSS-REFERENCE TO RELATED APPLICATIONS

The present application is a Continuation of PCT International Application No. PCT/JP2021/001558 filed on Jan. 19, 2021 claiming priority under 35 U.S.C § 119 (a) to Japanese Patent Application No. 2020-008232 filed on Jan. 22, 2020. Each of the above applications is hereby expressly incorporated by reference, in its entirety, into the present application.

BACKGROUND OF THE INVENTION

1. Field of the Invention

The present invention relates to an optical vibration-proof device, an optical device, and a fixing method of a magnetic sensor, and particularly relates to a technology for attaching a magnetic sensor that detects a position of a lens for shake correction to a base member.

2. Description of the Related Art

Generally, in an optical vibration-proof device, a lens for shake correction is moved in a plane orthogonal to an optical axis to suppress image shake caused by the shake of the optical device, such as camera shake in handheld imaging.

JP2016-157040A discloses a technology for positioning a magnetic sensor (hall element) that detects the position of a lens for shake correction.

The optical vibration-proof device disclosed in JP2016-157040A comprises a lens holding frame that holds the lens for shake correction, a base member that supports the lens holding frame in a displaceable manner along a plane orthogonal to an optical axis, and a flexible substrate on which a hall element that detects a change in a magnetic field of a magnet provided in the lens holding frame is mounted, in which the flexible substrate is positioned and fixed to one surface (surface opposite to the lens holding frame) of the base member.

In addition, the hall element mounted on the flexible substrate protrudes from the other surface of the lens holding frame (surface on the lens holding frame side) via an opening portion formed in the base member, and the protruding portion of the hall element is interposed between a pair of hall element biasing part and hall element fixing part integrally formed with the base member in a peripheral portion of the opening portion formed in the base member.

SUMMARY OF THE INVENTION

One embodiment according to the technology of the present disclosure is to provide an optical vibration-proof device, an optical device, and a fixing method of a magnetic sensor that can simply, accurately, and surely attach a magnetic sensor that detects a position of a lens for shake correction to a base member such that misregistration does not occur due to impact or aging.

A first aspect of the present invention relates to an optical vibration-proof device comprising a base member, a lens holding frame configured to be movable along a plane orthogonal to an optical axis with respect to the base member, a magnetic material that is moved integrally with the lens holding frame and generates a magnetic field, a magnetic sensor that detects a change in the magnetic field in accordance with movement of the lens holding frame, and a sensor attachment member that is fixed to the base member, in which the base member includes a positioning part, the sensor attachment member brings the magnetic sensor into contact with the positioning part to position the magnetic sensor, and the base member is formed integrally with the same member as the positioning part, and is formed as a separate member from the sensor attachment member.

In the optical vibration-proof device according to a second aspect of the present invention, it is preferable that the magnetic sensor be mounted on a print substrate, and the print substrate be fixed to the base member at a position between the lens holding frame and the base member.

In the optical vibration-proof device according to a third aspect of the present invention, it is preferable that the positioning part have an escape part that avoids interference with the print substrate in a case in which the magnetic sensor is brought into contact with the positioning part.

In the optical vibration-proof device according to a fourth aspect of the present invention, it is preferable that the print substrate be a flexible print substrate.

In the optical vibration-proof device according to a fifth aspect of the present invention, it is preferable that each of the sensor attachment member and the base member have a position regulation part capable of directly performing position regulation.

In the optical vibration-proof device according to a sixth aspect of the present invention, it is preferable that the base member have a first pin and a second pin, the sensor attachment member have a first hole and a second hole formed therein, and the sensor attachment member be positioned on the base member by inserting the first hole and the second hole into the first pin and the second pin, respectively.

In the optical vibration-proof device according to a seventh aspect of the present invention, it is preferable that the sensor attachment member have a fastening hole into which a fastener is inserted formed therein, and the sensor attachment member be fixed to the base member via the fastener that is inserted into the fastening hole and fixed to the base member.

In the optical vibration-proof device according to an eighth aspect of the present invention, it is preferable that the sensor attachment member also serve as a position regulation member that regulates a position of the magnetic sensor in an optical axis direction.

In the optical vibration-proof device according to a ninth aspect of the present invention, it is preferable that the sensor attachment member also serve as a fixing member that fixes the print substrate to the base member.

In the optical vibration-proof device according to a tenth aspect of the present invention, it is preferable that the sensor attachment member have an elastic part, and biases the magnetic sensor by an elastic force generated in the elastic part to bring the magnetic sensor into contact with the positioning part.

In the optical vibration-proof device according to an eleventh aspect of the present invention, it is preferable that each of the base member and the sensor attachment member be a molded product made of a resin.

In the optical vibration-proof device according to a twelfth aspect of the present invention, it is preferable that the sensor attachment member be a molded product made of a resin having a higher molding fluidity than the base member.

In the optical vibration-proof device according to a thirteenth aspect of the present invention, it is preferable that the base member and the sensor attachment member be made of different materials.

In the optical vibration-proof device according to a fourteenth aspect of the present invention, it is preferable that the sensor attachment member be a material having a lower modulus of elasticity than the base member.

In the optical vibration-proof device according to a fifteenth aspect of the present invention, it is preferable that the base member and the sensor attachment member be made of materials having the same linear expansion coefficient.

In the optical vibration-proof device according to a sixteenth aspect of the present invention, it is preferable that the base member be a material having a higher stiffness than the sensor attachment member.

In the optical vibration-proof device according to a seventeenth aspect of the present invention, it is preferable that the sensor attachment member have a shape having a larger ratio of a total length to a cross-sectional area than a shape of any portion of the base member.

In the optical vibration-proof device according to an eighteenth aspect of the present invention, it is preferable that the magnetic material be a magnet provided on the lens holding frame.

A nineteenth aspect of the present invention relates to an optical device comprising the optical vibration-proof device according to any one of first to eighteenth aspects.

A twentieth aspect of the present invention relates to a fixing method of a magnetic sensor in an optical vibration-proof device including a base member, a lens holding frame configured to be movable along a plane orthogonal to an optical axis with respect to the base member, a magnetic material that is moved integrally with the lens holding frame and generates a magnetic field, a magnetic sensor that detects a change in the magnetic field in accordance with movement of the lens holding frame, a print substrate on which the magnetic sensor is mounted, and a sensor attachment member that is fixed to the base member, and moving the lens holding frame in the plane orthogonal to the optical axis, the method comprising disposing the print substrate on a surface of the base member facing the lens holding frame, disposing the sensor attachment member on the base member with the print substrate interposed therebetween, bringing the magnetic sensor into contact with a positioning part provided integrally with the base member as the same member in a case of fixing the sensor attachment member, and fixing the sensor attachment member to the base member in a state in which the magnetic sensor is brought into contact with the positioning part.

DESCRIPTION OF THE PREFERRED EMBODIMENTS

In the following, preferred embodiments of an optical vibration-proof device, an optical device, and a fixing method of a magnetic sensor according to the present invention will be described with reference to the accompanying drawings.

[Optical Device]

Figure 1:
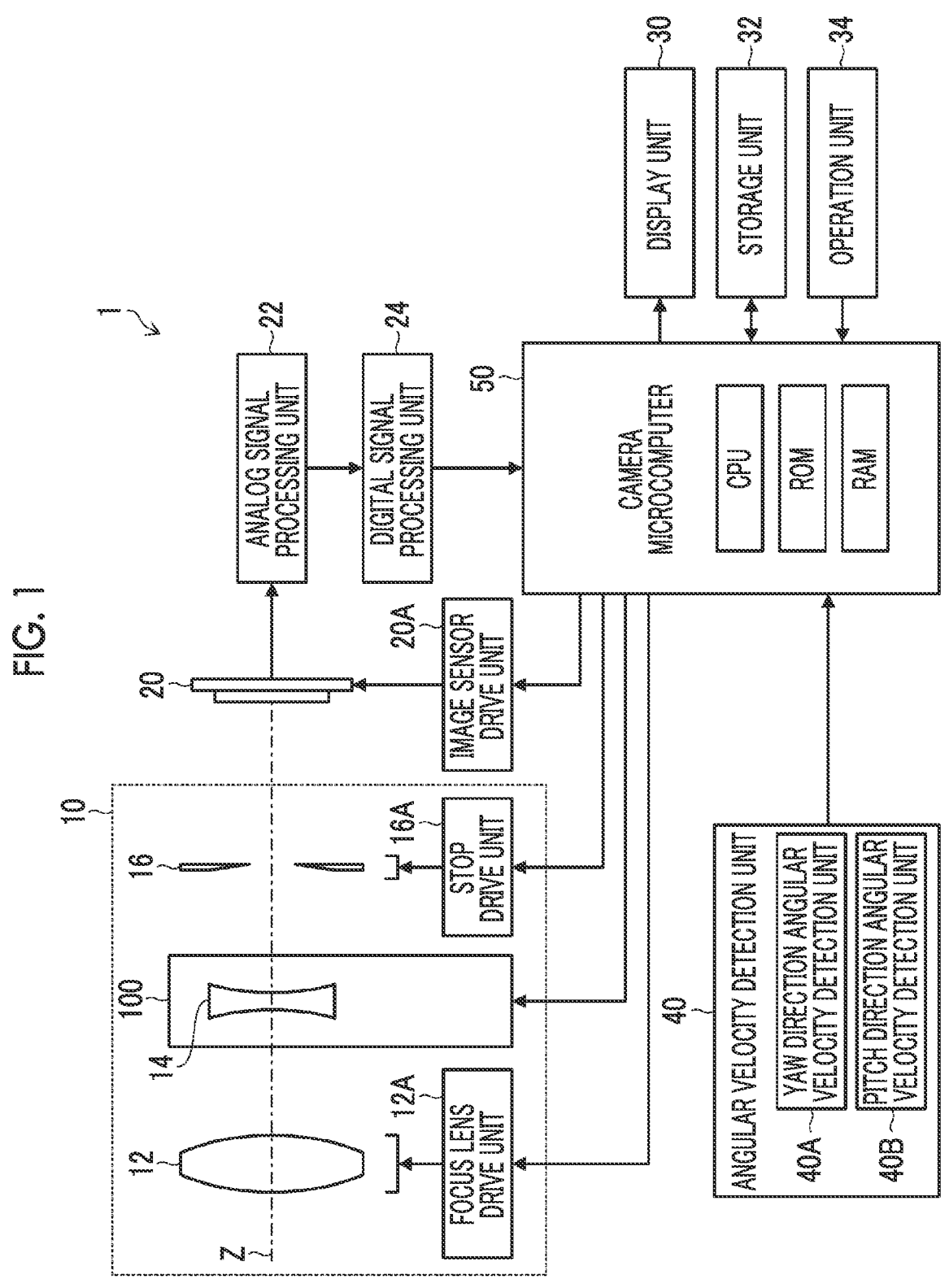
FIG. 1 is a block diagram showing an embodiment of a digital camera comprising an optical vibration-proof device.

FIG. 1 is a block diagram showing an embodiment of a digital camera which is the optical device comprising an optical vibration-proof device according to the embodiment of the present invention.

A digital camera 1 shown in FIG. 1 is a lens-integrated digital camera, and comprises a lens shift type optical vibration-proof device 100.

As shown in FIG. 1, the digital camera 1 comprises an imaging optical system 10, an image sensor 20, an image sensor drive unit 20A, an analog signal processing unit 22, a digital signal processing unit 24, a display unit 30, a storage unit 32, an operation unit 34, an angular velocity detection unit 40, a camera microcomputer 50, and the like.

The imaging optical system 10 is composed of a plurality of lens groups including a focus lens 12 and a shake correction lens 14. It should be noted that, for convenience, FIG. 1 shows only the focus lens 12 and the shake correction lens 14. The imaging optical system 10 comprises a stop 16 on an optical path thereof.

The focus lens 12 is a lens for adjusting a focus, and adjusts the focus of the imaging optical system 10 by moving back and forth along an optical axis z. The focus lens 12 is driven by a focus lens drive unit 12A. The focus lens drive unit 12A comprises a voice coil motor as an actuator and a drive circuit thereof. The focus lens drive unit 12A drives the voice coil motor in response to an instruction from the camera microcomputer 50 to move the focus lens 12.

The shake correction lens 14 is a lens for shake correction that corrects image shake caused by camera shake or the like in handheld imaging of the digital camera 1, and is moved in a plane orthogonal to the optical axis z to correct the image shake.

Figure 2:
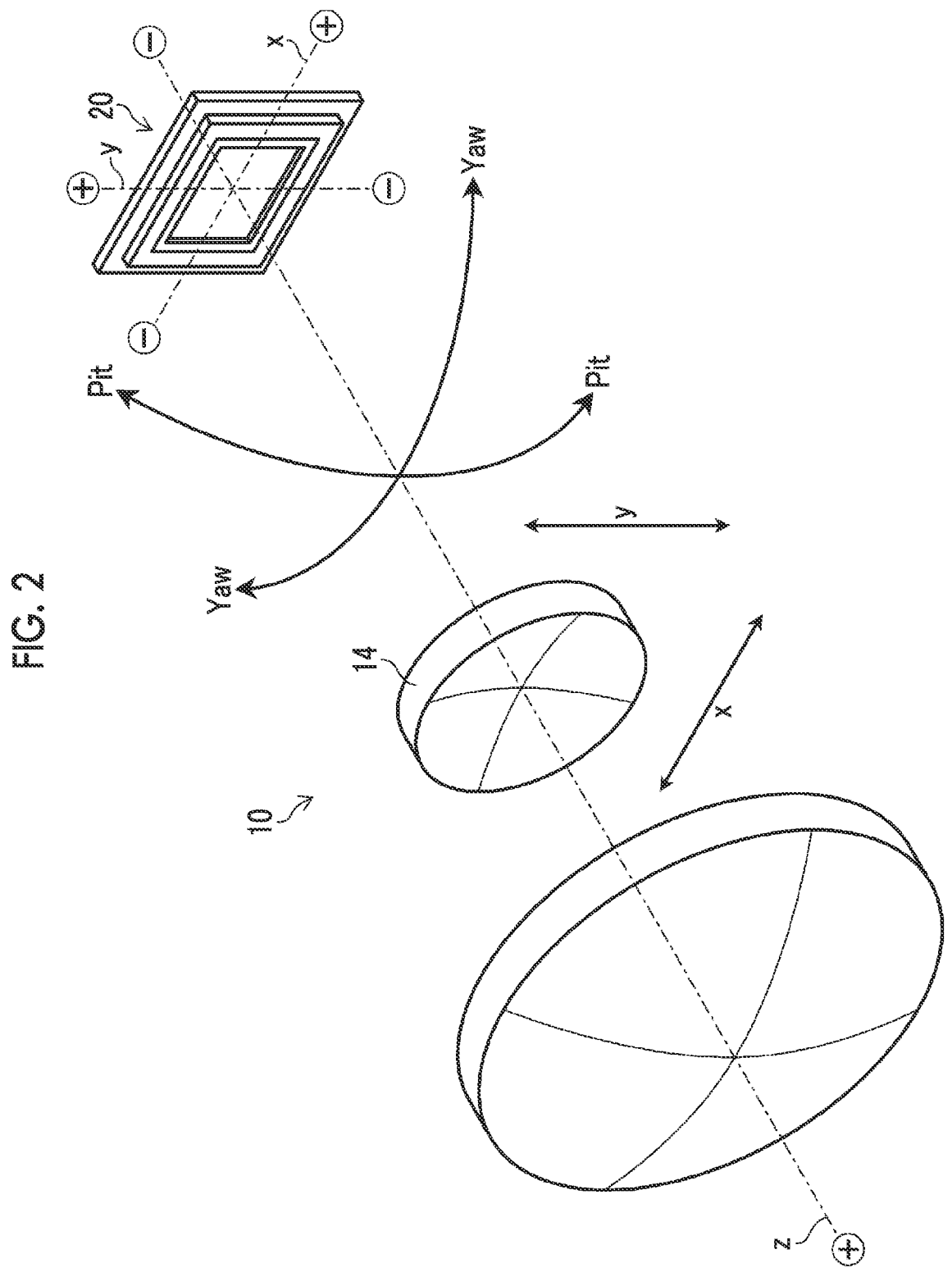
FIG. 2 is a conceptual diagram of movement of a shake correction lens.

FIG. 2 is a conceptual diagram of movement of the shake correction lens 14.

As shown in FIG. 2, the shake correction lens 14 is freely moved in an xy plane orthogonal to the optical axis z.

The x-axis is set as an axis that passes through a center of the image sensor 20 and is parallel to the upper and lower sides of the image sensor 20. The y-axis is set as an axis that passes through the center of the image sensor 20 and is parallel to the right and left sides of the image sensor 20. The x-axis direction is a horizontal direction of the digital camera 1, and the y-axis direction is a vertical direction of the digital camera 1. The x-axis and the y-axis are orthogonal to each other.

In a case of correcting the image shake, the shake correction lens 14 is moved in a direction of canceling the shake. The shake correction lens 14 is driven by the optical vibration-proof device 100. Details of the optical vibration-proof device 100 will be described below.

The stop 16 is composed of, for example, an iris stop. The stop 16 is driven by a stop drive unit 16A, and an aperture amount thereof is variable. The stop drive unit 16A comprises a motor as an actuator, and a drive circuit thereof. The stop drive unit 16A drives the motor in response to the instruction from the camera microcomputer 50 to change the aperture amount of the stop 16.

The image sensor 20 is a portion that receives an optical image showing a subject image passing through the imaging optical system 10 and transforms the optical image into an electric signal (image signal). The image sensor 20 is composed of, for example, a known image sensor, such as a complementary metal-oxide semiconductor (CMOS) type or a charge coupled device (CCD) type.

The image sensor drive unit 20A drives the image sensor 20 in response to the instruction from the camera microcomputer 50. By driving the image sensor 20 by the image sensor drive unit 20A, a charge corresponding to an amount of received light stored in each pixel is read out as the image signal.

The analog signal processing unit 22 captures an analog image signal for each pixel output from the image sensor 20, and performs predetermined signal processing (for example, sampling two correlation pile and amplification processing). The analog signal processing unit 22 includes an analog to digital converter (AD converter), and transforms the analog image signal after predetermined signal processing into a digital image signal and outputs the transformed digital image signal.

The digital signal processing unit 24 captures the digital image signal output from the analog signal processing unit 22 and performs predetermined signal processing (for example, gradation transformation processing, white balance correction processing, gamma-correction processing, demosaicing processing, and brightness color difference transformation processing) to generate image data. The generated image data is output to the camera microcomputer 50.

In addition, the digital signal processing unit 24 detects brightness information of the subject required for an exposure control based on the captured image signal. The detected brightness information of the subject is output to the camera microcomputer 50.

Further, the digital signal processing unit 24 detects contrast information of the subject required for an autofocus control based on the captured image signal. The detected contrast information is output to the camera microcomputer 50.

The display unit 30 displays various information including the image. The display unit 30 comprises a display device, such as a liquid crystal display or an organic electro luminescent (EL) display, and a drive circuit thereof.

A live view is displayed on the display unit 30 in addition to the captured image. The live view is a function of displaying the image captured by the image sensor in real time. By displaying the live view, it is possible to capture the image while checking the image on the display unit 30. In addition, the display unit 30 is also used as a display screen for a user interface in a case of making various settings. The display on the display unit 30 is controlled by the camera microcomputer 50.

The storage unit 32 stores various data including the image data. The storage unit 32 comprises a built-in memory and a control circuit that reads and writes the data to and from the built-in memory. The built-in memory is composed of a non-volatile memory, such as an electrically erasable programmable read only memory (EEPROM). The reading and writing of the data to and from the storage unit 32 is controlled by the camera microcomputer 50.

The storage unit 32 can also be composed of an external memory, such as a so-called memory card. In this case, the digital camera 1 comprises a card slot or the like for loading the memory card.

The operation unit 34 includes a general operation unit as the digital camera, such as a release button, a power switch, an imaging mode dial, a shutter speed dial, an exposure correction dial, a command dial, a menu button, a cross key, a decision button, a cancel button, an erase button, and a shake correction switch, and outputs a signal corresponding to the operation to the camera microcomputer 50.

Here, the shake correction switch is a switch that turns on and off a shake correction function. In a case in which the shake correction switch is turned on, the shake correction function is turned on, and in a case in which the shake correction switch is turned off, the shake correction function is turned off.

The angular velocity detection unit 40 detects the angular velocities of a yaw direction Yaw and a pitch direction Pit of the digital camera 1. As shown in FIG. 2, the yaw direction Yaw is a rotation direction around the y-axis, and is a rotation direction of the digital camera 1 in the horizontal direction. In addition, as shown in FIG. 2, the pitch direction Pit is a rotation direction around the x-axis and is a rotation direction of the digital camera 1 in the vertical direction.

The angular velocity detection unit 40 comprises a yaw direction angular velocity detection unit 40A and a pitch direction angular velocity detection unit 40B. An angular velocity signal indicating the angular velocity of the yaw direction Yaw detected by the yaw direction angular velocity detection unit 40A and an angular velocity signal indicating the angular velocity of the pitch direction Pit detected by the pitch direction angular velocity detection unit 40B are output to the camera microcomputer 50.

The camera microcomputer 50 functions as a control unit that integrally controls the overall operation of the digital camera 1. In addition, the camera microcomputer 50 functions as an arithmetic processing unit that calculates a physical quantity required for controlling the digital camera 1.

The camera microcomputer 50 is composed of a computer (microcomputer) comprising a central processing unit (CPU), a random access memory (RAM), and a read only memory (ROM). The camera microcomputer 50 executes a predetermined program to realize various functions. The program executed by the camera microcomputer 50 and various data required for the control are stored in the ROM.

Figure 3:
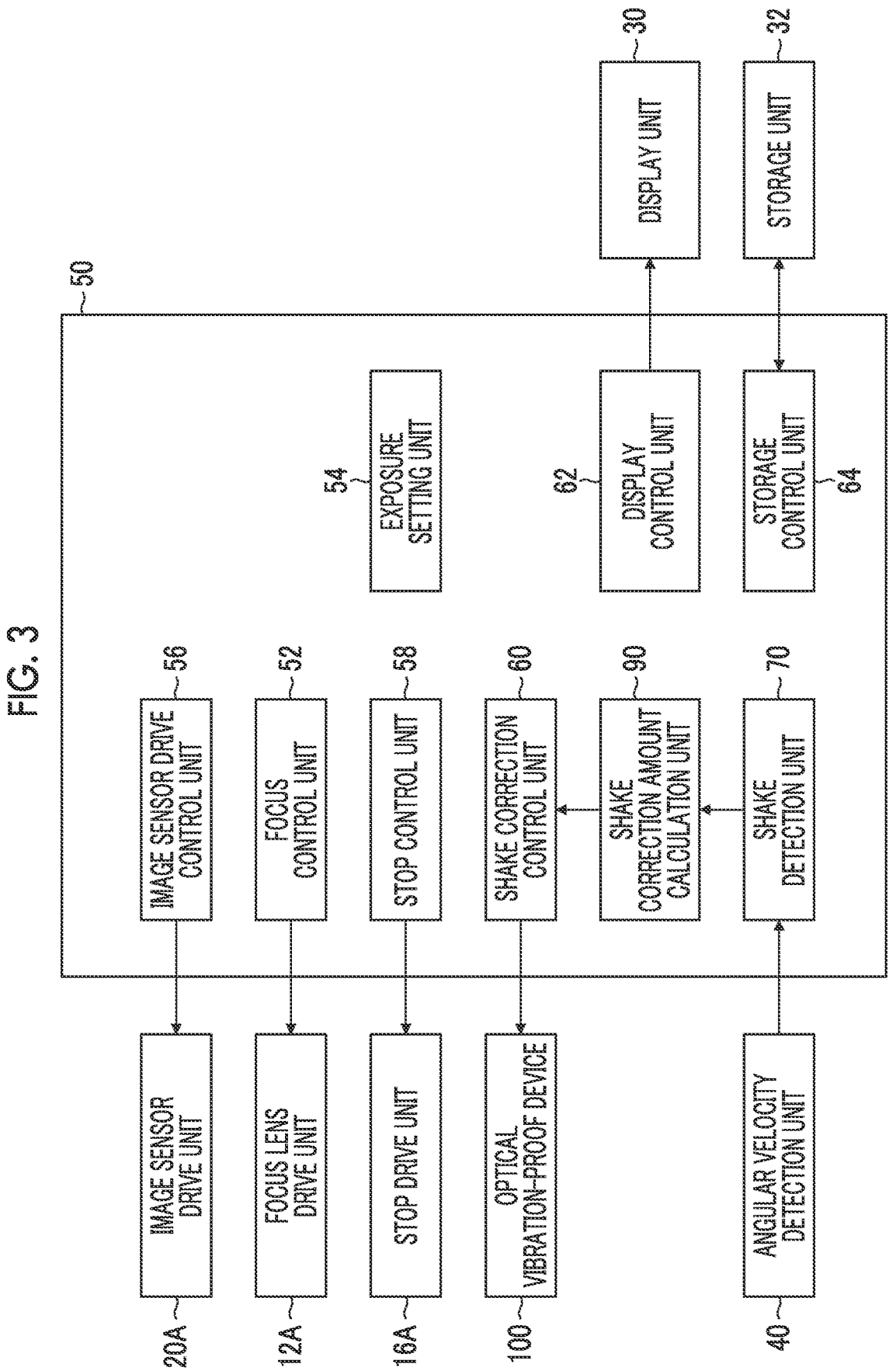
FIG. 3 is a block diagram of main functions realized by a camera microcomputer.

FIG. 3 is a block diagram of main functions realized by the camera microcomputer.

As shown in FIG. 3, the camera microcomputer 50 functions as a focus control unit 52, an exposure setting unit 54, an image sensor drive control unit 56, a stop control unit 58, a shake correction control unit 60, a display control unit 62, a storage control unit 64, a shake detection unit 70, a shake correction amount calculation unit 90, and the like.

The focus control unit 52 performs the autofocus control. That is, an in-focus state is detected, and the focus lens 12 is moved to perform focusing.

The exposure setting unit 54 sets a shutter speed (exposure time) and a stop value for appropriate exposure based on a detection result of the brightness of the subject.

The image sensor drive control unit 56 controls the drive of the image sensor 20 via the image sensor drive unit 20A such that the exposure is performed at the shutter speed set by the exposure setting unit 54.

The stop control unit 58 controls the aperture amount of the stop 16 via the stop drive unit 16A such that the aperture amount becomes the stop value set by the exposure setting unit 54.

The display control unit 62 controls the display of the display unit 30. For example, in a case in which the image data obtained by imaging is displayed on the display unit 30, the image data is transformed into a data format that can be displayed on the display unit 30 and output the transformed image data to the display unit 30.

The storage control unit 64 controls reading and writing of the data to and from the storage unit 32. The image data obtained by imaging is stored in the storage unit 32 via the storage control unit 64. In addition, in a case in which the image data stored in the storage unit 32 is reproduced, the image data is read out from the storage unit 32 via the storage control unit 64.

The shake detection unit 70 calculates a shake amount of the digital camera 1 based on the detection results of the angular velocities of the yaw direction Yaw and the pitch direction Pit detected by the angular velocity detection unit 40. Specifically, the angular velocity signal in the yaw direction Yaw output from the yaw direction angular velocity detection unit 40A is integrated to calculate the shake amount in the yaw direction Yaw. In addition, the angular velocity signal in the pitch direction Pit output from the pitch direction angular velocity detection unit 40B is integrated to calculate the shake amount in the pitch direction Pit.

The shake correction amount calculation unit 90 calculates the shake correction amount based on the shake amount in the yaw direction Yaw and the shake amount in the pitch direction Pit detected by the shake detection unit 70. The shake correction amount is calculated as a movement amount of the shake correction lens 14 required for cancelling the detected shake. Specifically, the shake correction amount is calculated as the movement amount of the shake correction lens 14 in the x-axis direction and the y-axis direction required for cancelling the shake.

The shake correction control unit 60 controls the movement of the shake correction lens 14 based on the shake correction amount calculated by the shake correction amount calculation unit 90 to correct the image shake.

<Optical Vibration-Proof Device>

Figure 4:
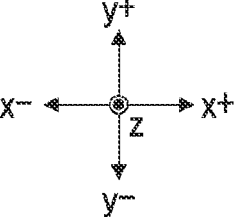
FIG. 4 is a front view of the optical vibration-proof device according to the embodiment of the present invention.
Figure 5:
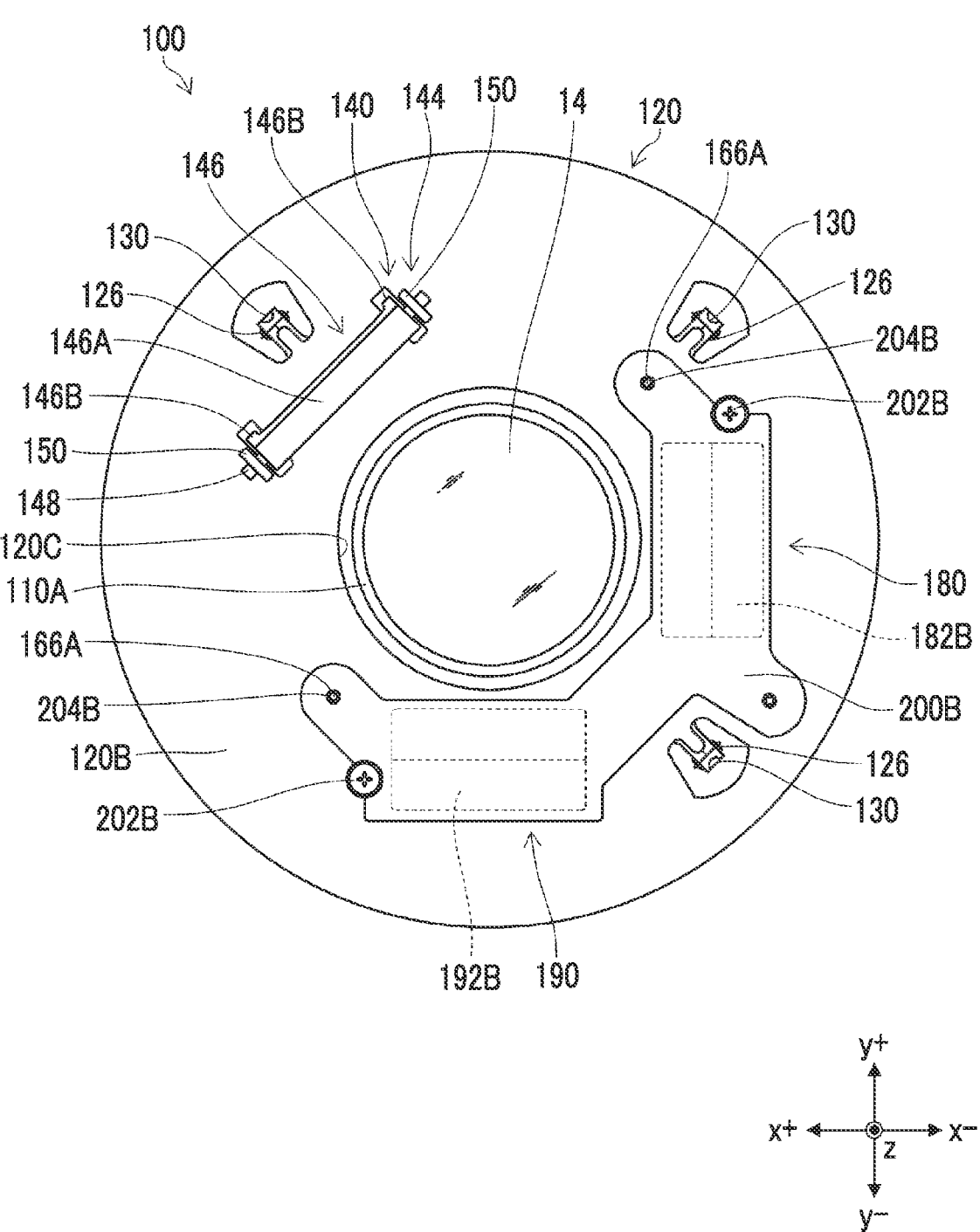
FIG. 5 is a rear view of the optical vibration-proof device shown in FIG. 4.

FIG. 4 is a front view of the optical vibration-proof device according to the embodiment of the present invention. FIG. 5 is a rear view of the optical vibration-proof device shown in FIG. 4.

The optical vibration-proof device 100 comprises a lens holding frame 110 that holds the shake correction lens 14, a base member 120 that supports the lens holding frame 110 to be movable in the plane orthogonal to the optical axis, a rotation regulation part 140 that regulates the rotation of the lens holding frame 110, a movable range regulation part 160 that regulates a movable range of the lens holding frame 110, an x-axis direction drive unit 180 that drives the lens holding frame 110 in the x-axis direction, a y-axis direction drive unit 190 that drives the lens holding frame 110 in the y-axis direction, a position detection unit 210 in the x-axis direction that detects the position of the lens holding frame 110 in the x-axis direction, and a position detection unit 220 in the y-axis direction that detects the position of the lens holding frame 110 in the y-axis direction.

Figure 6:
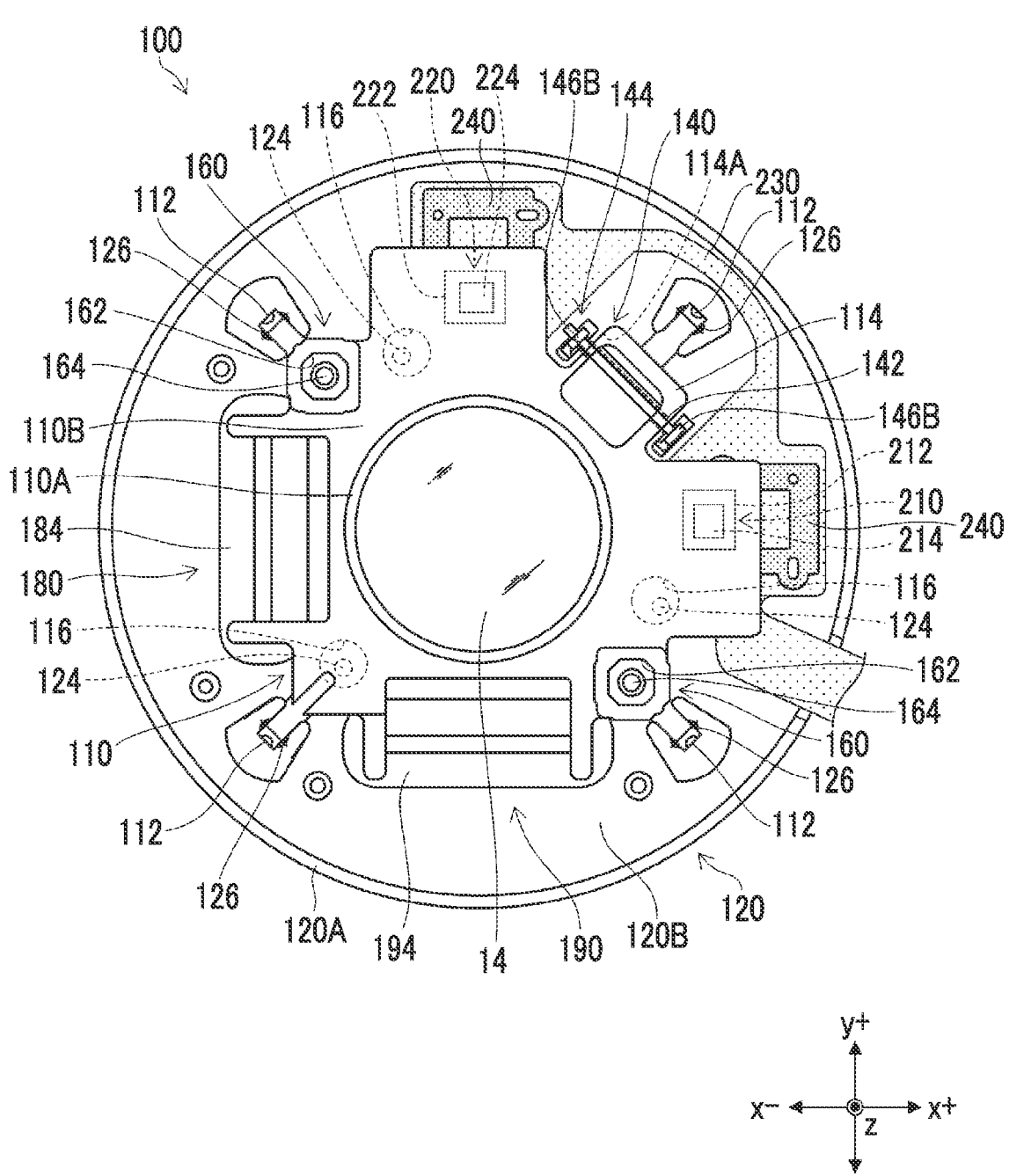
FIG. 6 is a front view of the optical vibration-proof device with an exposed lens holding frame.

FIG. 6 is a front view of the optical vibration-proof device with the exposed lens holding frame.

The lens holding frame 110 has a cylindrical lens holder 110A and a flange part 110B projecting to the outside of the lens holder 110A. The shake correction lens 14 is held in an inner peripheral portion of the lens holder 110A.

Figure 7:
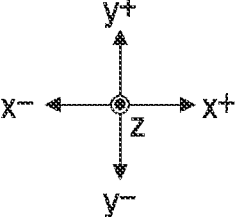
FIG. 7 is a front view of a base member.

FIG. 7 is a front view of the base member.

The base member 120 according to the present embodiment is a molded product made of a resin. As the material of the base member 120, for example, a glass fiber reinforced polycarbonate (PC) resin containing glass fiber can be used, but the present invention is not limited to this, and various resins can be applied.

The base member 120 includes a cylindrical lens barrel part 120A, a fixed side ball housing part 128 that houses a ball 124, a fixed side spring hook part 130 on which one end of a spring 126 is hooked, and positioning parts 132 and 134 used for positioning a position detection hall element 214 in the x-axis direction and a position detection hall element 224 in the y-axis direction described below.

The lens barrel part 120A, the fixed side ball housing part 128, the fixed side spring hook part 130, the positioning parts 132 and 134, and the like are integrally formed by the resin of the same member to form the base member 120. The base member 120 has an opening 120B at the center.

The base member 120 comprises a plurality of balls 124 that support the lens holding frame 110 to be movable, and a plurality of springs 126 that biases the lens holding frame 110 toward the base member 120.

The fixed side ball housing part 128 is provided on a surface of the lens holding frame 110 facing the flange part 110B. The fixed side ball housing part 128 is composed of a rectangular recess portion, and is provided at three locations of the base member 120.

The fixed side spring hook part 130 is composed of a hook-shaped protruding portion extending outward in a radial direction, and is provided at four locations of the base member 120.

As shown in FIG. 6, the lens holding frame 110 comprises a movable side ball housing part 116 and a movable side spring hook part 112 corresponding to the fixed side ball housing part 128 and the fixed side spring hook part 130 provided in the base member 120.

The movable side ball housing part 116 is composed of a circular recess portion and is provided on a surface facing the base member 120.

The movable side spring hook part 112 is composed of a hook-shaped protruding portion extending outward in the radial direction, and is provided at four locations of the flange part 110B.

The spring 126 is composed of a coil spring and is disposed in parallel to the optical axis z. One end of the spring 126 is hooked on the fixed side spring hook part 130 of the base member 120, and the other end thereof is hooked on the movable side spring hook part 112 of the lens holding frame 110. As a result, the lens holding frame 110 is biased toward the base member 120.

The ball 124 is interposed between the lens holding frame 110 and the base member 120 by biasing the lens holding frame 110 toward the base member 120. As a result, the lens holding frame 110 is movably supported with respect to the base member 120.

The rotation regulation part 140 comprises a guide shaft 142 disposed orthogonal to the optical axis z, a swing base member 144 that swingably supports the guide shaft 142, and a guide part 114 that is integrally provided on the lens holding frame 110 and guides the lens holding frame 110 along the guide shaft 142.

The guide shaft 142 is composed of a metal round bar and is disposed orthogonal to the optical axis z.

The swing base member 144 includes a bracket 146 that holds the guide shaft 142, a swing shaft 148 provided on the bracket 146, and a shaft base member 150 that supports the swing shaft 148. The bracket 146 has a base 146A and a pair of arm parts 146B extending in parallel from the base 146A, and has a U-shaped shape as a whole. Both ends of the guide shaft 142 are supported by the pair of arm parts 146B. The swing shaft 148 is provided on the base 146A and is disposed in parallel to the guide shaft 142. The shaft base member 150 is integrally provided on the base member 120 and rotatably supports both ends of the swing shaft 148. The swing shaft 148 supported by the shaft base member 150 is disposed orthogonal to the optical axis z. As a result, the guide shaft 142 is swingably supported around an axis orthogonal to the optical axis z.

The guide part 114 is provided integrally with the flange part 110B of the lens holding frame 110. The guide part 114 has a guide groove 114A in which the guide shaft 142 is fitted on a surface facing the base member 120. The guide groove 114A is composed of a U-shaped groove and is disposed orthogonal to the optical axis of the shake correction lens 14.

The rotation of the lens holding frame 110 around the optical axis is regulated by fitting the guide shaft 142 into the guide groove 114A of the guide part 114. In addition, the lens holding frame 110 is slidably supported along the guide shaft 142 by fitting the guide shaft 142 into the guide groove 114A of the guide part 114. As a result, the lens holding frame 110 is movably supported in the plane orthogonal to the optical axis z. That is, since the guide shaft 142 is swingably supported around the axis orthogonal to the optical axis z, the guide shaft 142 does not hinder the movement of the lens holding frame 110 even in a case in which the lens holding frame 110 is moved in the plane orthogonal to the optical axis. As a result, the lens holding frame 110 is movably supported in the plane orthogonal to the optical axis z.

As described above, the lens holding frame 110 is movably supported in the plane orthogonal to the optical axis z, but may be movably supported in a plane substantially orthogonal to the optical axis z as long as the performance is not impaired.

As shown in FIG. 6, the movable range regulation part 160 comprises a movable range regulation hole 162 provided in the lens holding frame 110, and a stopper 164 that is inserted into the movable range regulation hole 162 and regulates the movable range of the lens holding frame 110. The stopper 164 is attached to the base member 120.

The movable range regulation hole 162 is an example of an opening portion. The movable range regulation hole 162 is provided at two locations of the flange part 110B of the lens holding frame 110. Each movable range regulation hole 162 is disposed at a position symmetrical with respect to the optical axis of the shake correction lens 14.

The x-axis direction drive unit 180 is composed of the voice coil motor, and drives the lens holding frame 110 in the x-axis direction.

As shown in FIGS. 4 and 5, the voice coil motor constituting the x-axis direction drive unit 180 comprises a pair of yokes 200A and 200B, a pair of x-axis direction driving magnets 182A and 182B, and an x-axis direction driving coil 184.

The pair of yokes 200A and 200B are made of a magnetic metal plate, such as a steel plate. The pair of yokes 200A and 200B are attached to a front surface and a back surface of the base member 120 by being screwed with screws 202A and 202B. The yokes 200A and 200B attached to the base member 120 are arranged at a certain interval in a direction of the optical axis z and are disposed orthogonal to the optical axis z.

The pair of x-axis direction driving magnets 182A and 182B are integrally attached to the corresponding yokes 200A and 200B. The pair of x-axis direction driving magnets 182A and 182B are disposed at predetermined positions of the base member 120 by attaching the yokes 200A and 200B to the base member 120. Specifically, the pair of x-axis direction driving magnets 182A and 182B are disposed on the x-axis (centers of the x-axis direction driving magnets 182A and 182B are positioned on the x-axis), and are arranged to face each other at a certain interval in the direction of the optical axis z. The pair of x-axis direction driving magnets 182A and 182B are disposed at intermediate positions of the two stoppers 164 in the direction (y-axis direction) orthogonal to the x-axis direction.

The x-axis direction driving coil 184 is provided on the flange part 110B of the lens holding frame 110. The x-axis direction driving coil 184 is disposed between the pair of x-axis direction driving magnets 182A and 182B. In addition, the x-axis direction driving coil 184 passes through the center of the shake correction lens 14 and is disposed on a straight line parallel to the x-axis.

The x-axis direction drive unit 180 configured as described above moves the lens holding frame 110 in the x-axis direction by energizing the x-axis direction driving coil 184. The y-axis direction drive unit 190 is composed of the voice coil motor, and drives the lens holding frame 110 in the y-axis direction.

The voice coil motor constituting the y-axis direction drive unit 190 comprises the pair of yokes 200A and 200B, a pair of y-axis direction driving magnets 192A and 192B, and a y-axis direction driving coil 194.

The pair of yokes 200A and 200B are made of the magnetic metal plate, such as the steel plate. The pair of yokes 200A and 200B are attached to the front surface and the back surface of the base member 120 by being screwed with the screws 202A and 202B. The yokes 200A and 200B attached to the base member 120 are arranged at a certain interval in the direction of the optical axis z and are disposed orthogonal to the optical axis z.

The pair of y-axis direction driving magnets 192A and 192B are integrally attached to the corresponding yokes 200A and 200B. The pair of y-axis direction driving magnets 192A and 192B are disposed at predetermined positions of the base member 120 by attaching the yokes 200A and 200B to the base member 120. Specifically, the pair of y-axis direction driving magnets 192A and 192B are disposed on the y-axis (centers of the y-axis direction driving magnets 192A and 192B are positioned on the y-axis), and are arranged to face each other at a certain interval in the direction of the optical axis z. The pair of y-axis direction driving magnets 192A and 192B are disposed at intermediate positions of the two stoppers 164 in the direction (x-axis direction) orthogonal to the y-axis direction.

The y-axis direction driving coil 194 is provided on the flange part 110B of the lens holding frame 110. The y-axis direction driving coil 194 is disposed between the pair of y-axis direction driving magnets 192A and 192B. In addition, the y-axis direction driving coil 194 passes through the center of the shake correction lens 14 and is disposed on a straight line parallel to the y-axis.

The y-axis direction drive unit 190 configured as described above moves the lens holding frame 110 in the y-axis direction by energizing the y-axis direction driving coil 194.

<<Position Detection Unit in x-Axis Direction and Position Detection Unit in y-Axis Direction>>

<Position Detection Unit in x-Axis Direction>

As shown in FIGS. 4 and 7, the position detection unit 210 in the x-axis direction detects the position of the lens holding frame 110 in the x-axis direction. The position detection unit 210 comprises a position detection magnet (magnetic material) 212 in the x-axis direction and the position detection hall element 214 in the x-axis direction.

The position detection hall element 214 is a magnetic sensor that detects the magnetic field formed by the position detection magnet 212 in the x-axis direction.

The position detection hall element 214 according to the present embodiment is formed as a linear hall integrated circuit (IC) in which two hall elements are built in a package, and has detection sensitivity to the movement in the x-axis direction of the position detection magnet 212 in the x-axis direction.

The position detection magnet 212 in the x-axis direction is provided on the flange part 110B of the lens holding frame 110 (see FIG. 4), and the position detection hall element 214 is fixed to the base member 120 (see FIG. 7).

It should be noted that the details of the structure and fixing method of fixing the position detection hall element 214 to the base member 120 will be described below.

The position detection unit 210 in the x-axis direction detects the position of the position detection magnet 212 in the x-axis direction by the position detection hall element 214, and detects the position of the lens holding frame 110 in the x-axis direction (that is, the position of the shake correction lens 14 in the x-axis direction).

<Position Detection Unit in y-Axis Direction>

The position detection unit 220 in the y-axis direction detects the position of the lens holding frame 110 in the y-axis direction, and is configured in the same manner as the position detection unit 210 in the x-axis direction.

That is, the position detection unit 220 in the y-axis direction comprises a position detection magnet (magnetic material) 222 in the y-axis direction and a position detection hall element 224 in the y-axis direction.

The position detection hall element 224 is a magnetic sensor that detects the magnetic field formed by the position detection magnet 222 in the y-axis direction, and has detection sensitivity to the movement in the y-axis direction of the position detection magnet 222.

The position detection magnet 222 in the y-axis direction is provided on the flange part 110B of the lens holding frame 110, and the position detection hall element 224 is fixed to the base member 120.

The position detection unit 210 in the y-axis direction detects the position of the position detection magnet 222 in the y-axis direction by the position detection hall element 224, and detects the position of the lens holding frame 110 in the y-axis direction (that is, the position of the shake correction lens 14 in the y-axis direction).

<Shake Correction>

Hereinafter, a shake correction method (drive control method of the optical vibration-proof device) by the optical vibration-proof device 100 will be described.

In a case in which the shake correction function is turned on, the digital camera 1 is subjected to the shake correction. In a case in which the shake correction function is turned on, the shake detection unit 70 shown in FIG. 3 detects the shake amount of the digital camera 1, and the shake correction amount calculation unit 90 calculates the shake correction amount based on the detection result. Then, based on the calculation result by the shake correction amount calculation unit 90, the movement of the shake correction lens 14 is controlled by the shake correction control unit 60, and the image shake is corrected. In this case, the movement of the shake correction lens 14 is controlled with reference to a predetermined origin position, and the movement of the shake correction lens 14 is controlled within a predetermined shake correction control range.

In a case in which the power of the digital camera 1 is turned off, the shake correction lens 14 loses its holding force and falls freely. In this case, the shake correction lens 14 is held by the stopper 164.

<Fixation Structure of Position Detection Hall Element>

As shown in FIG. 7, the position detection hall element 214 in the x-axis direction and the position detection hall element 224 in the y-axis direction are each packaged and mounted on a flexible print substrate 230.

The flexible print substrate 230 is fixed to the base member 120 by two sensor attachment members 240, and as a result, the position detection hall elements 214 and 224 are fixed to the base member 120.

<<First Embodiment of Sensor Attachment Member>>

Figure 8:
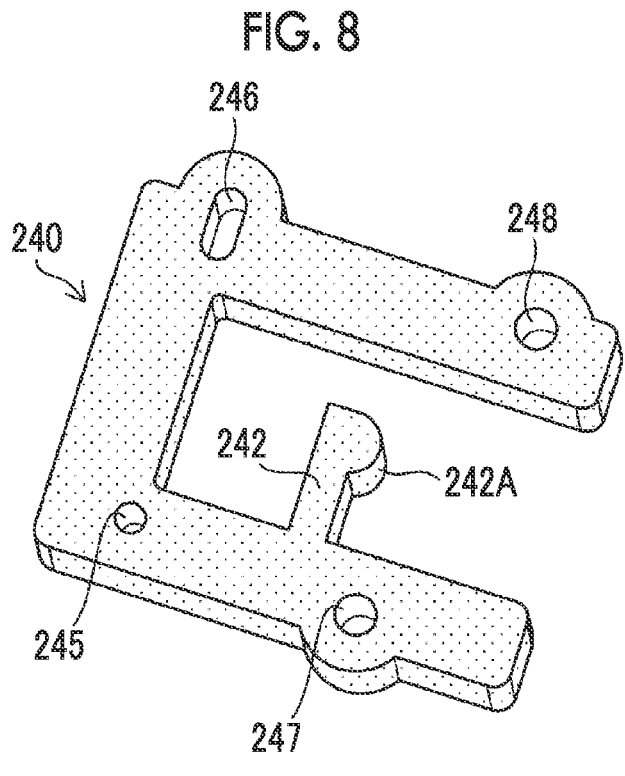
FIG. 8 is a perspective view showing a first embodiment of a sensor attachment member.
Figure 9:
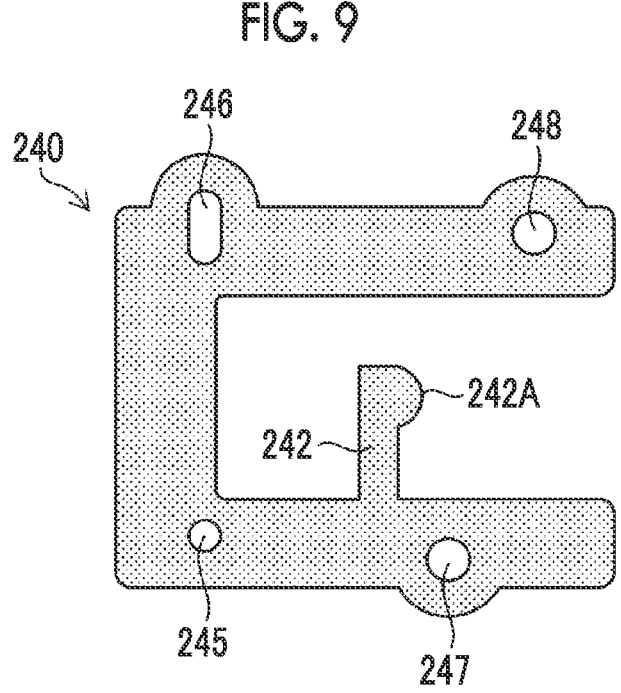
FIG. 9 is a plan view of the sensor attachment member shown in FIG. 8.

FIG. 8 is a perspective view showing a first embodiment of the sensor attachment member, and FIG. 9 is a plan view of the sensor attachment member shown in FIG. 8.

The sensor attachment member 240 according to the present embodiment is a molded product made of a resin, and is formed as a separate member from the base member 120. As the material of the sensor attachment member 240, for example, an ABS resin can be used, but the material is not limited to this, and various resins can be applied.

It should be noted that the resin applied to the sensor attachment member 240 is preferably a resin having a higher molding fluidity than the resin applied to the base member 120. This is because, as will be described below, the sensor attachment member 240 has a shape having a ratio of a total length to a cross-sectional area larger than a shape of any portion of the base member 120.

In addition, the base member 120 and the sensor attachment member 240 are manufactured of different materials, the sensor attachment member 240 is preferably made of a material having a lower modulus of elasticity than the base member 120, and the base member 120 is preferably made of a material having a higher stiffness than the sensor attachment member 240.

Since a glass fiber reinforced PC resin containing glass fiber is applied to the base member 120 according to the present embodiment and a PC resin not containing glass fiber is applied to the sensor attachment member 240, the characteristics of the material described above are satisfied.

In addition, it is preferable that the base member 120 and the sensor attachment member 240 be made of materials having the same linear expansion coefficient. The sensor attachment member 240 is fixed to the base member 120, but by manufacturing both the sensor attachment member 240 and the base member 120 with the same material having the same linear expansion coefficient, it is possible to suppress the occurrence of a dimensional change (thermal stress) therebetween. It should be noted that the linear expansion coefficients thereof are not limited to a case in which the linear expansion coefficients are completely the same. In a case in which the dimensional change due to the difference between the linear expansion coefficients thereof is sufficiently smaller than a detection error of the position detection hall elements 214 and 224 or is small enough not to affect the position detection accuracy of the position detection hall elements 214 and 224, the difference in the linear expansion coefficients is acceptable.

As shown in FIGS. 8 and 9, the sensor attachment member 240 has a U-shaped outer shape and has a cantilever elastic part 242 extending toward a space at the center thereof. At a distal end of the elastic part 242, a protruding portion 242A that biases the position detection hall element by the elastic force generated in the elastic part 242 is formed.

In addition, the sensor attachment member 240 is formed with a first hole 245 and a second hole 246 for positioning, and further, fastening holes 247 and 248 into which a fastener (male screw) is inserted.

Figure 10:
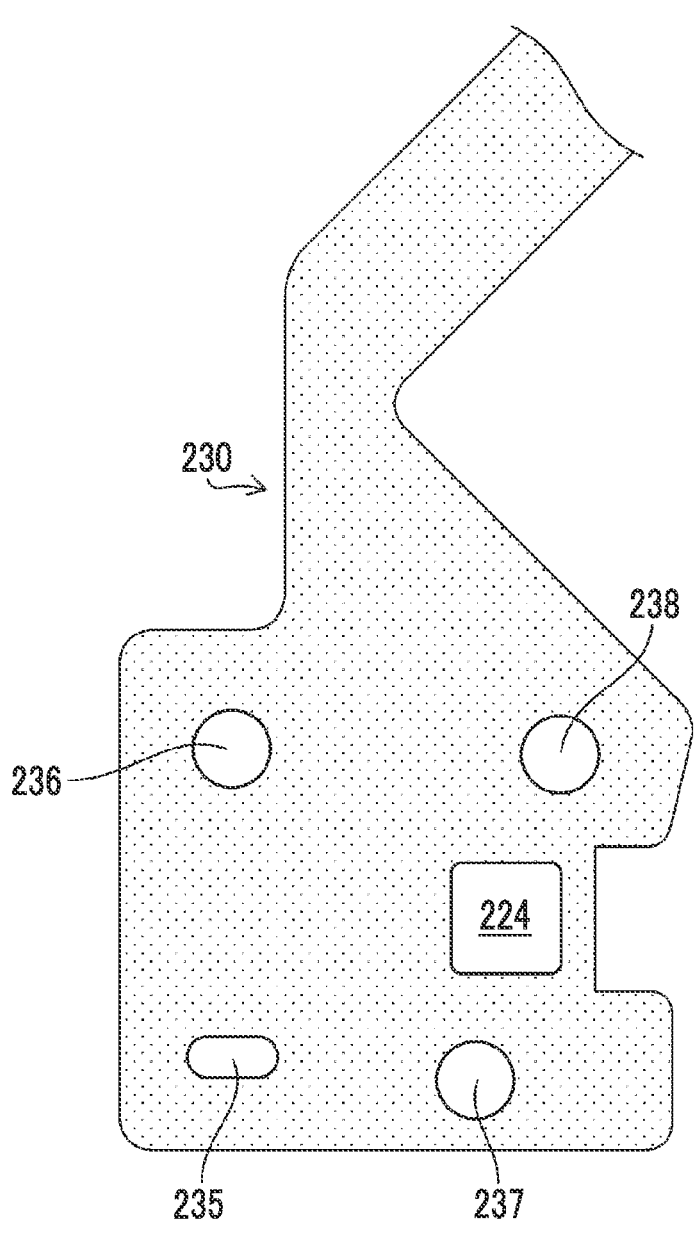
FIG. 10 is a plan view of a distal end portion of a flexible print substrate.
Figure 11:
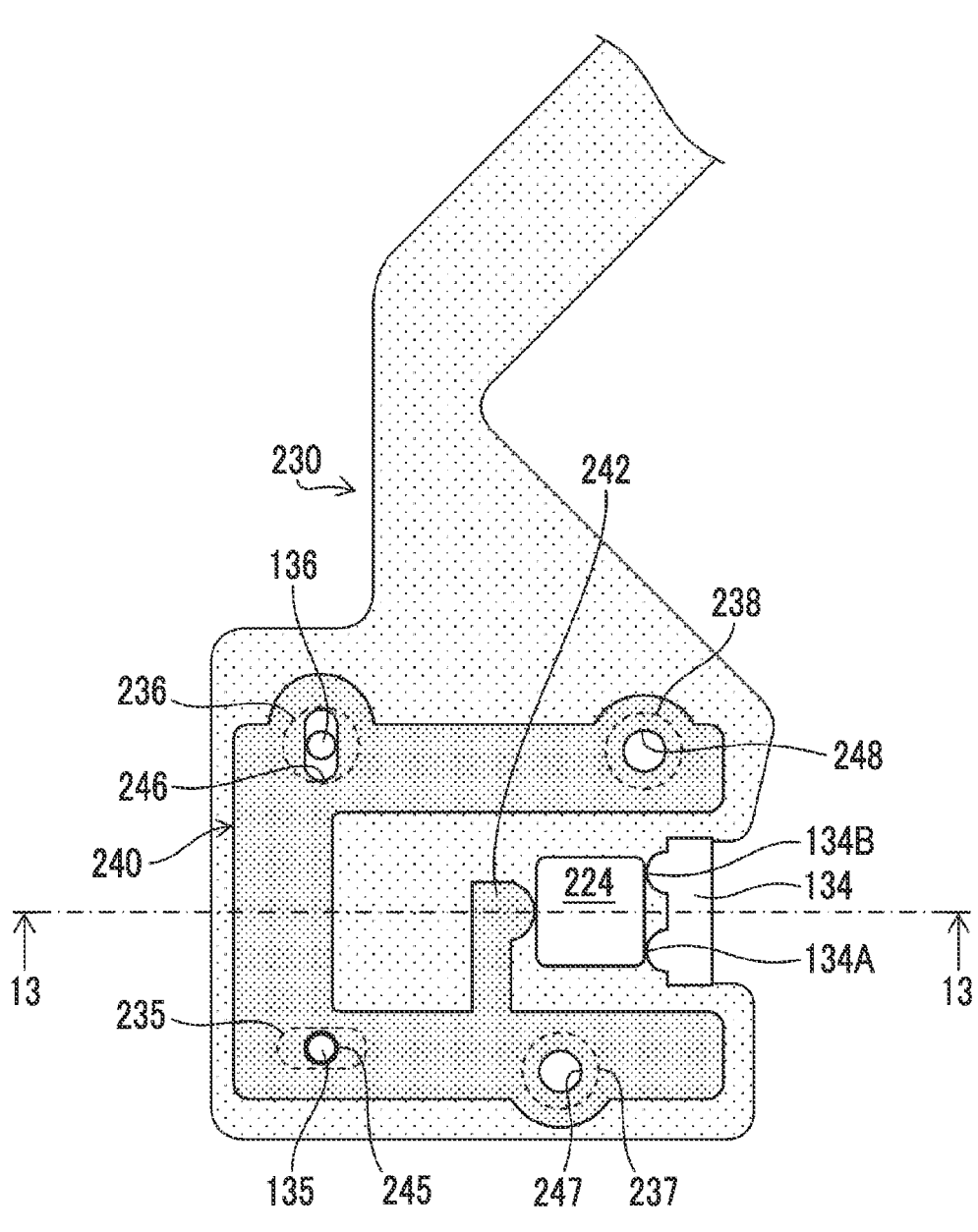
FIG. 11 is a plan view showing a state in which the sensor attachment member is disposed at the distal end portion of the flexible print substrate.

FIG. 10 is a plan view of a distal end portion of the flexible print substrate, and FIG. 11 is a plan view showing a state in which the sensor attachment member is disposed at the distal end portion of the flexible print substrate.

The position detection hall element 224 in the y-axis direction is mounted on the distal end portion of the flexible print substrate 230 shown in FIG. 10.

At the distal end portion of the flexible print substrate 230, a third hole 235 and a fourth hole 236 corresponding to the first hole 245 and the second hole 246 for positioning of the sensor attachment member 240, respectively, and fastening holes 237 and 238 corresponding to the fastening holes 247 and 248 of the sensor attachment member 240, respectively, are formed.

The third hole 235, the fourth hole 236, and the fastening holes 237 and 238 formed in the flexible print substrate 230 are formed to be larger than the first hole 245, the second hole 246, and the fastening holes 247 and 248 formed in sensor attachment member 240. This is to make the flexible print substrate 230 slightly movable with respect to the base member 120.

It should be noted that it is needless to say that the third hole 235, the fourth hole 236, and the fastening holes 237 and 238 are also formed as described above in a portion of the flexible print substrate 230 on which the position detection hall element 214 in the x-axis direction is mounted.

<<Fixing Method of Magnetic Sensor>>

Next, the fixing method of the magnetic sensor will be described in which the flexible print substrate 230 on which the position detection hall element 214 in the x-axis direction and the position detection hall element 224 in the y-axis direction are mounted is fixed to the base member 120 by using the two sensor attachment members 240, and the position detection hall elements 214 and 224 (magnetic sensor) are positioned and fixed.

Figures 12, 13:
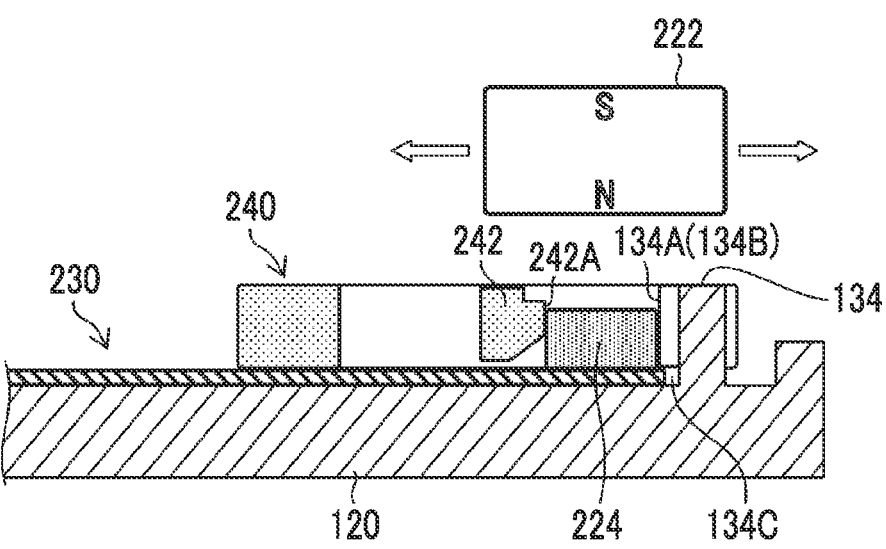
FIG. 12 is a diagram showing a state in which the flexible print substrate is disposed on a base member.
FIG. 13 is a cross-sectional view taken along a line 13-13 of FIG. 11.

FIG. 12 is a diagram showing a state in which the flexible print substrate is disposed on the base member.

As shown in FIGS. 11 and 12, a first pin 135 and a second pin 136 are integrally formed on the base member 120. The first hole 245 and the second hole 246 for positioning formed in the sensor attachment member 240, and the first pin 135 and the second pin 136 formed in the base member 120 are position regulation parts that can directly perform position regulation of the sensor attachment member 240 and the base member 120.

The third hole 235 and the fourth hole 236 formed in the flexible print substrate 230 are loosely inserted into the first pin 135 and the second pin 136 of the base member 120, respectively, and the flexible print substrate 230 is disposed to movable to one surface (surface facing the lens holding frame 110) of the base member 120.

Subsequently, the first hole 245 and the second hole 246 of the sensor attachment member 240 are inserted into the first pin 135 and the second pin 136 of the base member 120, respectively, and the sensor attachment member 240 is positioned on the base member 120.

Thereafter, the sensor attachment member 240 is pushed toward the flexible print substrate 230.

FIG. 13 is a cross-sectional view taken along a line 13-13 of FIG. 11.

As shown in FIG. 13, the elastic part 242 of the sensor attachment member 240 has a tapered lower surface of the protruding portion 242A at the distal end thereof, the sensor attachment member 240 is pushed toward the flexible print substrate 230 to press the position detection hall element 224 in the right direction on FIG. 13 and is moved together with the flexible print substrate 230.

In this case, one side surface of the package of the position detection hall element 224 is brought into contact with the two protruding portions 134A and 134B of the positioning part 134 of the base member 120, the other surface of the package is brought into contact with the protruding portion 242A at the distal end of the elastic part 242 of the sensor attachment member 240, and the package of the position detection hall element 224 is pressed by the elastic force generated in the elastic part 242.

It should be noted that, as shown in FIGS. 12 and 13, the positioning part 134 is formed with an escape part 134C that avoids the interference between the flexible print substrate 230 and the positioning part 134 in a case in which the package of the position detection hall element 224 is brought into contact with the positioning part 134 (two protruding portions 134A and 134B).

The elastic part 242 formed on the sensor attachment member 240 has a shape having a large ratio of the total length to the cross-sectional area.

This is because in a case in which the elastic part 242 is used as the spring as described above, the shape having a large ratio of the total length to the cross-sectional area is advantageous in terms of a spring characteristic. More specifically, the advantageous point in terms of the spring characteristic is that, for example, a displacement amount of the spring can be large and a change in the load due to a displacement error is small.

In addition, the elastic part 242 formed on the sensor attachment member 240 has the shape having a ratio of the total length to the cross-sectional area larger than the shape of any portion (for example, the fixed side spring hook part 130, the first pin 135, the second pin 136, and the like) of the base member 120.

One side surface of the package of the position detection hall element 224 (side surface in contact with the two protruding portions 134A and 134B of the positioning part 134) is a reference surface orthogonal to the y-axis direction which is the detection direction of the position detection hall element 224, and the reference surface is brought into contact with the two protruding portions 134A and 134B of the positioning part 134 integrally formed on the base member 120, so that the position detection hall element 224 is accurately positioned on the base member 120.

As a result, in a case in which the lens holding frame 110 (position detection magnet 222) is moved in the right-left direction on FIG. 13 with respect to the base member 120, the position of the position detection magnet 222 in the right-left direction can be accurately detected.

Similarly, the position detection hall element 214 in the x-axis direction can also be accurately positioned on the base member 120 by using the sensor attachment member 240 and the positioning part 132 formed on the base member 120.

In addition, by integrally providing the positioning parts 132 and 134 on the base member 120, the position detection hall elements 214 and 224 can be accurately positioned on the base member 120 as a reference for displacing the shake correction lens 14.

On the other hand, since the position detection hall elements 214 and 224 are brought into contact with the positioning parts 132 and 134 by using the two sensor attachment members 240 which are separate components from the base member 120, the sensor attachment member 240 having the shape having a large ratio of the total length to the cross-sectional area can be formed as a separate component without being restricted by processing, such as a molding condition of the base member 120 in a case of biasing the position detection hall elements 214 and 224 using the spring force of the elastic part 242 of the sensor attachment member 240. As a result, it is possible to form the elastic part 242 that exhibits an excellent spring characteristic with a long effective length of the spring, and it is possible to stably position the position detection hall elements 214 and 224.

Figure 14:
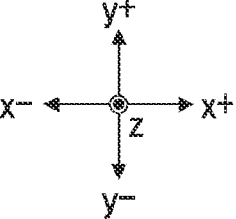
FIG. 14 is a plan view of the base member showing a state in which the flexible print substrate is disposed on the base member and two position detection hall elements are positioned by two sensor attachment members.

FIG. 14 is a plan view of the base member showing a state in which the flexible print substrate is disposed on the base member and the two position detection hall elements are positioned by the two sensor attachment members, and the sensor attachment member 240 is not fixed to the base member 120 in the state shown in FIG. 14.

Figure 15:
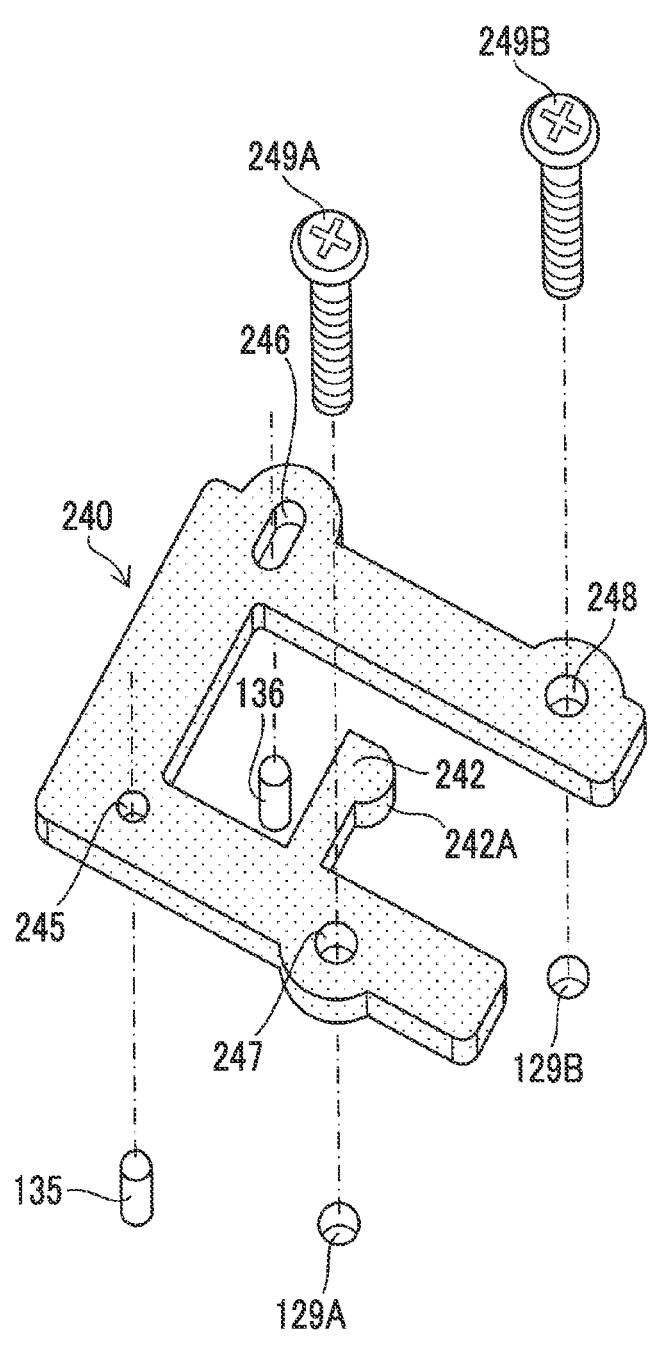
FIG. 15 is a perspective view showing a state in which the sensor attachment member is fixed to the base member by a fastener.
Figures 16A, 16B:
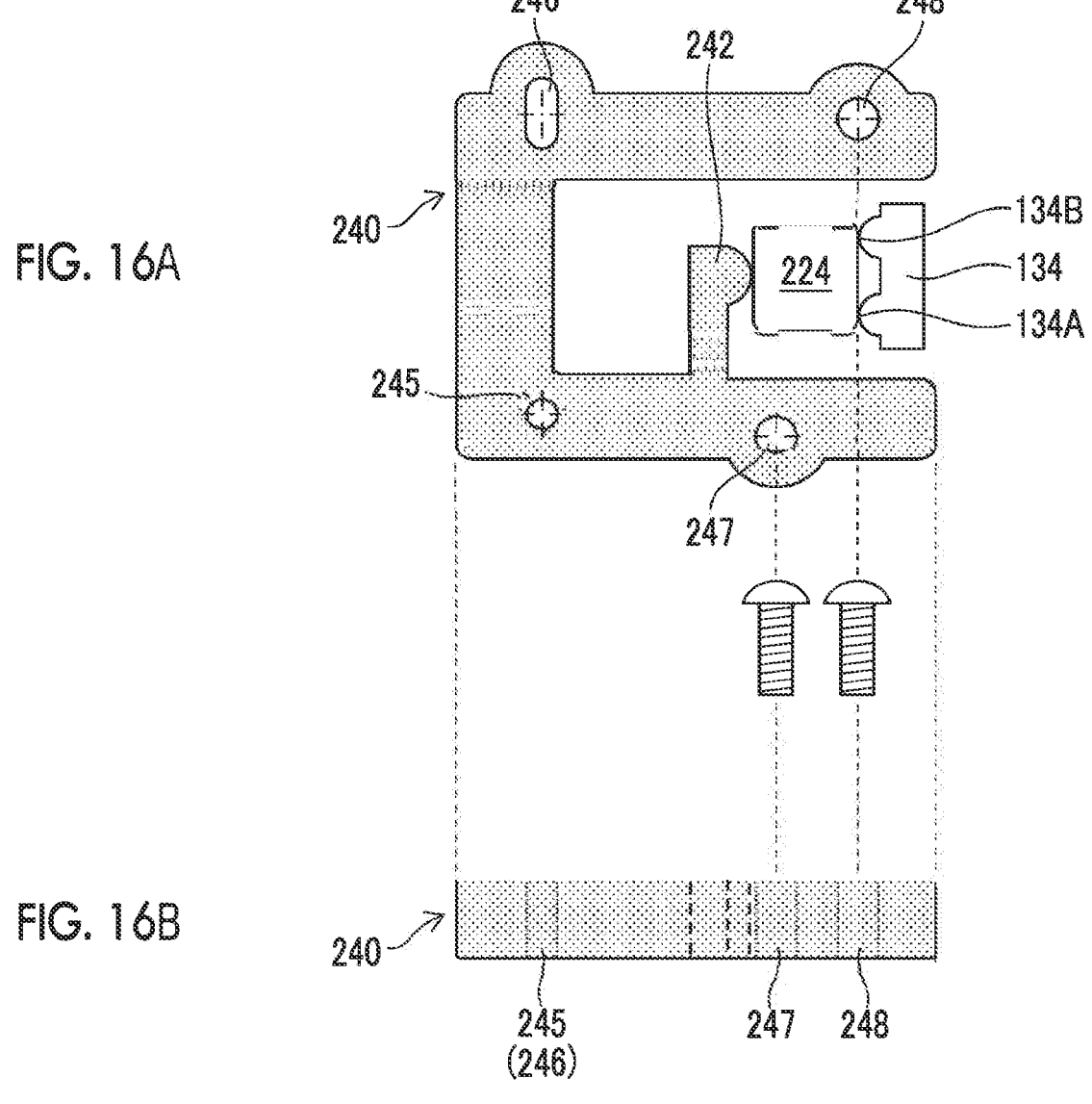
FIGS. 16A and 16B are a plan view and a side view of the sensor attachment member, respectively.

FIG. 15 is a perspective view showing a state in which the sensor attachment member is fixed to the base member by a fastener, and FIGS. 16A and 16B are a plan view and a side view of the sensor attachment member, respectively.

As shown in FIGS. 15, 16A, and 16B, two male screws 249A and 249B, which are the fasteners, are screwed into screw holes 129A and 129B of the base member 120 via the fastening holes 247 and 248 of the sensor attachment member 240, and the sensor attachment member 240 is fixed to the base member 120 with the flexible print substrate 230 interposed therebetween.

As a result, the flexible print substrate 230 (position detection hall element mounted on the flexible print substrate 230) is also fixed to the base member 120. It should be noted that the fastener that fixes the sensor attachment member 240 to the base member 120 is not limited to a combination of the male screw and the screw hole. In addition, in FIG. 15, the flexible print substrate 230 is not shown.

A metallic screw, such as iron and stainless steel, is usually used as a fastener with high accuracy, high strength, and easy assembly, but non-magnetic metal brass screws are used in the male screws 249A and 249B.

In a case in which the magnetic material is used as the fastener, there is a concern that the magnetic field of the magnet is disturbed to generate the position detection error or the movement of the lens holding frame is hindered due to the magnetic force of the magnet. Therefore, it is desirable to use a non-magnetic material, such as non-magnetic metal or ceramic, as the fastener, and it is most preferable to use the non-magnetic metal screw, such as brass, in terms of the ease of assembly.

The two sensor attachment members 240 shown in FIG. 7 described above are different from those of FIG. 14 in that the two sensor attachment members 240 are fixed to the base member 120 by the two male screws 249A and 249B, respectively.

As shown in FIG. 7 and the like, the sensor attachment member 240 also serves as a fixing member that fixes the flexible print substrate 230 to the base member 120.

In addition, since the position detection hall elements 214 and 224 are also closely fixed to the surface of the base member 120, the sensor attachment member 240 also serves as a position regulation member that regulates the positions of the position detection hall elements 214 and 224 (magnetic sensor) in the optical axis direction.

<<Second Embodiment of Sensor Attachment Member>>

Figure 17:
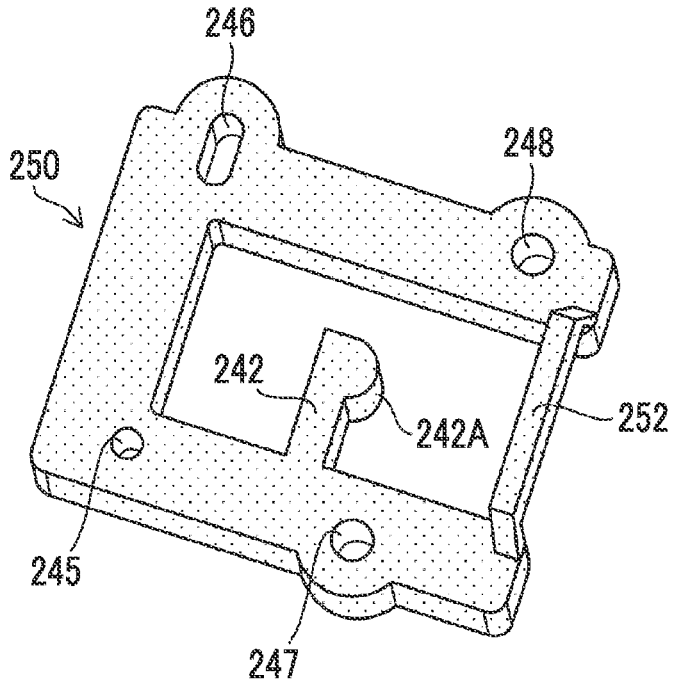
FIG. 17 is a perspective view showing a second embodiment of the sensor attachment member.
Figures 18A, 18B:
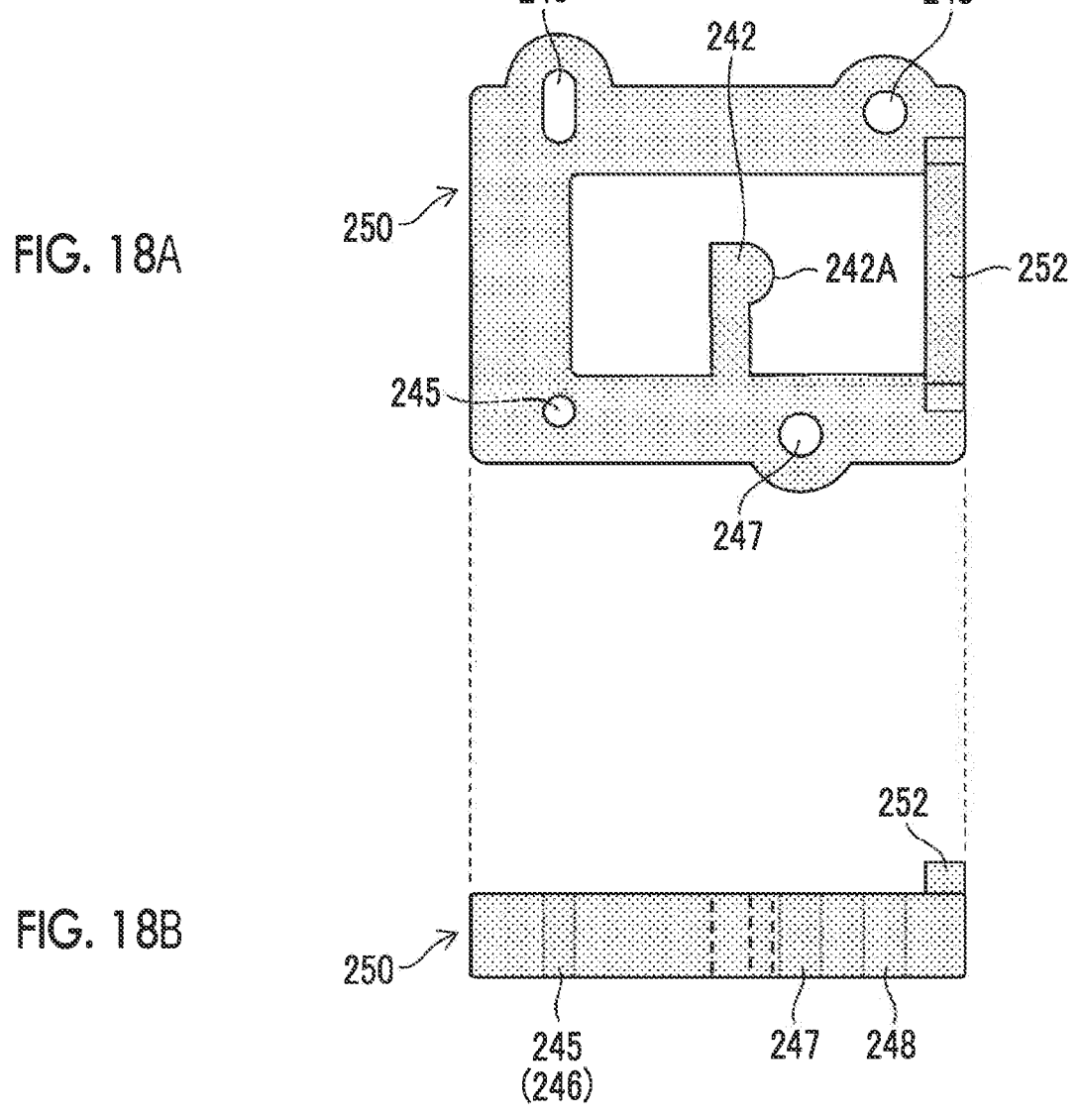
FIGS. 18A and 18B are plan views of the sensor attachment member shown in FIG. 17.

FIG. 17 is a perspective view showing a second embodiment of the sensor attachment member, and FIGS. 18A and 18B are plan views of the sensor attachment member shown in FIG. 17. It should be noted that, in FIGS. 17, 18A and 18B, the same reference numerals are given to the portions common to the sensor attachment member 240 according to the first embodiment shown in FIGS. 8 and 9, and the detailed description thereof will be omitted.

A sensor attachment member 250 according to the second embodiment is different from the sensor attachment member 240 according to the first embodiment in that an arch-shaped coupling part 252 is integrally formed.

The coupling part 252 couples distal ends of a pair of attachment parts of the sensor attachment member 240 according to the first embodiment having the U-shaped outer shape to each other, and the sensor attachment member 250 has a frame-like shape having the elastic part 242 and an opening portion in the center as a whole.

The stiffness of the sensor attachment member 250 according to the second embodiment is increased by the coupling part 252 as compared with the sensor attachment member 240 according to the first embodiment. As a result, for example, the sensor attachment member 250 is pushed toward the flexible print substrate 230 in a case in which the position detection hall element is positioned, but in this case, it is possible to deform only the elastic part 242 and to prevent the other portions from being deformed.

In addition, the coupling part 252 is formed in an arch shape, thereby avoiding the interference with the positioning part 134 formed on the base member 120.

<<Third Embodiment of Sensor Attachment Member>>

Figure 19:
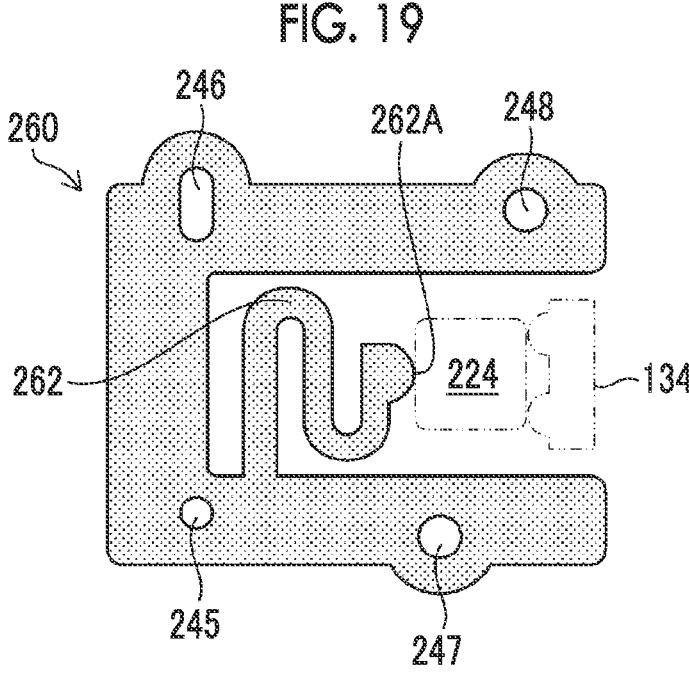
FIG. 19 is a plan view of a third embodiment of the sensor attachment member.

FIG. 19 is a plan view of a third embodiment of the sensor attachment member. It should be noted that, in FIG. 19, the same reference numerals are given to the portions common to the sensor attachment member 240 according to the first embodiment shown in FIGS. 8 and 9, and the detailed description thereof will be omitted.

In a sensor attachment member 260 according to the third embodiment, a shape of an elastic part 262 formed on the sensor attachment member 260 is different from the shape of the elastic part 242 formed on the sensor attachment member 240 according to the first embodiment.

The elastic part 262 of the sensor attachment member 260 is bent like a hairpin, and a total length thereof is formed to be longer than the total length of the elastic part 242 formed on the sensor attachment member 240.

As a result, since the elastic part 262 that functions as the spring that presses the position detection hall element 224 can have a long effective length of the spring, the change in the load is small with respect to the displacement error, and since an internal stress is also small, an excellent spring characteristic with little decrease in the load due to "settling" and the like are exhibited, so that the position detection hall element 224 can be more stably positioned.

<<Fourth Embodiment of Sensor Attachment Member>>

Figure 20:
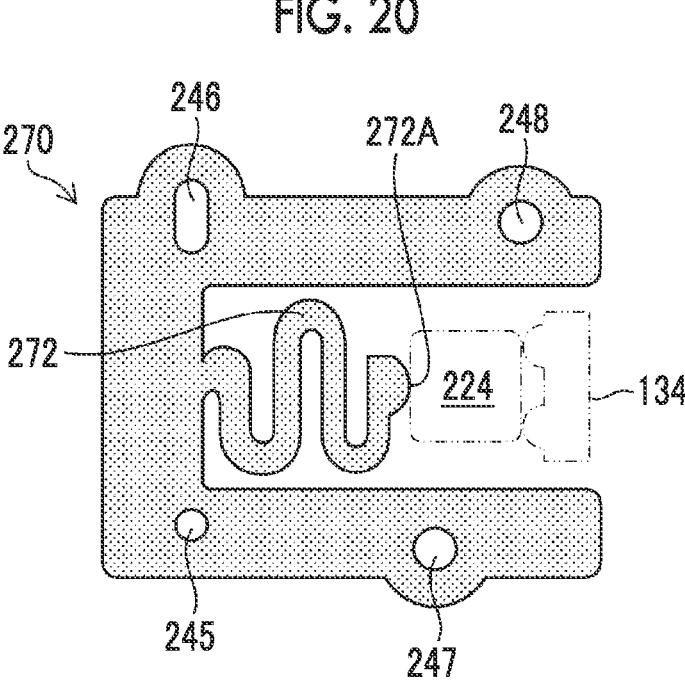
FIG. 20 is a plan view of a fourth embodiment of the sensor attachment member.

FIG. 20 is a plan view of a fourth embodiment of the sensor attachment member. It should be noted that, in FIG. 20, the same reference numerals are given to the portions common to the sensor attachment member 240 according to the first embodiment shown in FIGS. 8 and 9, and the detailed description thereof will be omitted.

Similar to the sensor attachment member 260 according to the third embodiment shown in FIG. 19, in a sensor attachment member 270 according to the fourth embodiment, a shape of an elastic part 272 formed on the sensor attachment member 270 is different from the shape of the elastic part 242 formed on the sensor attachment member 240 according to the first embodiment.

The elastic part 272 of the sensor attachment member 270 extends from a central member coupling the pair of attachment parts of the sensor attachment member 270 and is bent like a hairpin. In addition, a total length of the elastic part 272 is formed to be further longer than the total length of the elastic part 262 formed on the sensor attachment member 260 according to the third embodiment.

As a result, the elastic part 272 that functions as the spring that presses the position detection hall element 224 exhibits an excellent spring characteristic with a long effective length of the spring, and it is possible to more stably position the position detection hall element 224.

<<Another Embodiment of Position Detection Unit>>

Figure 21:
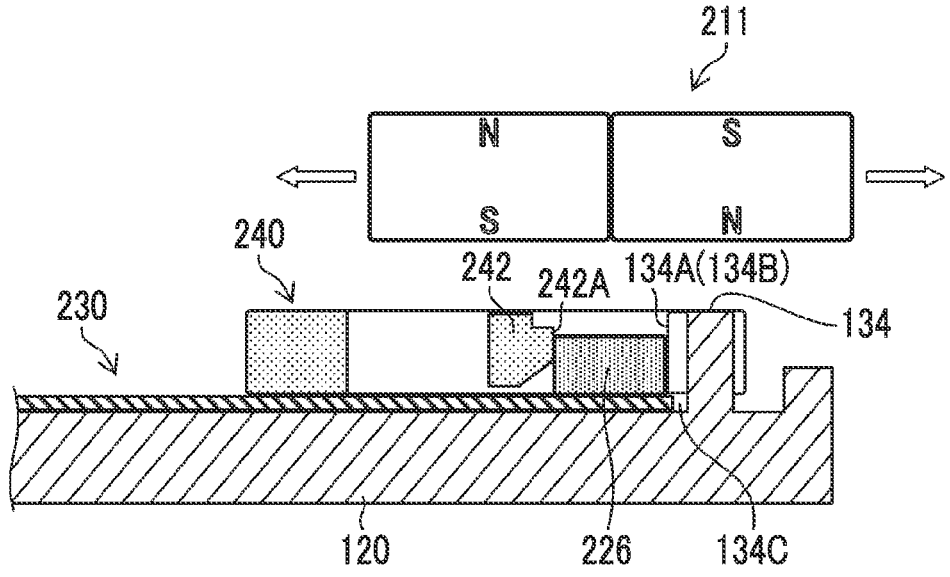
FIG. 21 is a diagram showing another embodiment of a position detection unit that detects a position of the lens holding frame.

FIG. 21 is a diagram showing another embodiment of the position detection unit that detects the position of the lens holding frame.

The position detection unit shown in FIG. 21 comprises a position detection magnet 211 and a position detection hall element 226.

The position detection magnet 211 is a two-pole magnet having a magnetized portion magnetized by two poles. The position detection magnet 211 is disposed on the lens holding frame 110.

The position detection hall element 226 is different from the position detection hall elements 214 and 224 formed as the linear hall IC in which two hall elements are built in the package in that the position detection hall element 226 is formed as a linear hall IC in which one hall element is built in the package.

In the position detection hall element 226, the position detection magnet 211 is moved from a reference position shown in FIG. 21 in the right-left direction on FIG. 21 and the N pole of the position detection magnet 211 approaches, an output voltage is increased in accordance with the strength of the N pole, and in a case in which the S pole approaches, the output voltage is decreased in accordance with the strength of the S pole.

As a result, the position detection unit shown in FIG. 21 can have a sensitivity to the movement of the position detection magnet 211 in the right-left direction on FIG. 21, and can detect the movement position of the lens holding frame 110.

[Others]

In the present embodiment, the case has been described in which the hall element is used as the magnetic sensor that detects the change in the magnetic field of the magnetic material, but the present invention is not limited to this, and for example, a magneto resistive (MR) sensor can be applied.

The sensor attachment member according to the present embodiment is the molded product made of the resin, but the present invention is not limited to this, and a processed product, such as a non-magnetic metal or ceramic, may be used.

In the present embodiment, the case has been described in which different materials are used for the base member and the sensor attachment member, but the present invention is not limited to this, even in a case in which the materials are the same, the sensor attachment member need only be formed as a separate member. As an example, in a case of a polycarbonate (PC) injection molded product in which the base member and the sensor attachment member contain 30% of the same glass fiber, in a case in which a mold for molding the base member and a mold for molding the sensor attachment member are different, since the mold itself of the sensor attachment member is small, an injection pressure from a gate can be easily reached, and the molding condition, such as a temperature adjustment, can be easily controlled, so that relatively fine and complicated structure as compared to a larger mold, such as the base member, can be accurately created. For example, in a case of the spring, a thin and long spring can be constructed on a small component, and the spring that is resistant to stress stability or "settling" can be obtained.

Even in a case of a structure other than the spring, since a shape of the structural part that gives the abutting force is not restricted by the processing of the base member, which is a large component, a structure that gives a stable abutting force can be realized.

As another example, even in a case of cutting, since a movement range of a blade is smaller as a processing size is smaller, a processing machine suitable for finer processing (processing machine with a small moving distance of the blade) can be selected. In this way, even in a case in which the materials are the same, by forming the sensor attachment member as a separate member, it is possible to accurately create relatively fine component shape without being restricted by the processing and molding conditions of the base member, and it is possible to stably apply the abutting force for being in contact with the positioning part in an initial stage and over time.

In addition, the sensor attachment member need only have at least a pressing part that brings the magnetic sensor into contact with the positioning part of the base member.

The substrate on which the magnetic sensor is mounted is not limited to the flexible print substrate, and may be a non-flexible print substrate.

Further, in the embodiments described above, the digital camera comprising the optical vibration-proof device has been described, but the application of the optical vibration-proof device to the optical device is not limited to the digital camera, and can be applied to other optical devices. Examples of other optical devices include various imaging apparatuses, such as a so-called silver halide camera, a television camera, and a video camera, and lens devices used in the imaging apparatuses.

In addition, the present invention is not limited to the embodiments, and can be subjected to various modifications without departing from the spirit of the present invention.

EXPLANATION OF REFERENCES

1: digital camera
10: imaging optical system
12: focus lens
12A: focus lens drive unit
14: shake correction lens
16: stop
16A: stop drive unit
20: image sensor
20A: image sensor drive unit
21: position detection magnet
22: analog signal processing unit
24: digital signal processing unit
30: display unit
32: storage unit
34: operation unit
40: angular velocity detection unit
40A: yaw direction angular velocity detection unit
40B: pitch direction angular velocity detection unit
50: camera microcomputer
52: focus control unit
54: exposure setting unit
56: image sensor drive control unit
58: stop control unit
60: shake correction control unit
62: display control unit
64: storage control unit
70: shake detection unit
90: shake correction amount calculation unit
100: optical vibration-proof device
110: lens holding frame
110A: lens holder
110B: flange part
112: movable side spring hook part
114: guide part
114A: guide groove
116: movable side ball housing part
120: base member
120A: lens barrel part
120B: opening
124: ball
126: spring
128: fixed side ball housing part
129A, 129B: screw hole
130: fixed side spring hook part
132, 134: positioning part
134A, 134B: protruding portion
134C: escape part
135: first pin
136: second pin 140: rotation regulation part
142: guide shaft
144: swing base member
146: bracket
146A: base
146B: arm part
148: swing shaft
150: shaft base member
160: movable range regulation part
162: movable range regulation hole
164: stopper
180: x-axis direction drive unit
182A, 182B: x-axis direction driving magnet
184: x-axis direction driving coil
190: y-axis direction drive unit
192A, 192B: y-axis direction driving magnet
194: y-axis direction driving coil
200A, 200B: yoke
202A, 202B: screw
210, 220: position detection unit
211, 212, 222: position detection magnet
214: position detection hall element
224, 226: position detection hall element
230: flexible print substrate
235: third hole
236: fourth hole
237, 238: fastening hole
240, 250, 260, 270: sensor attachment member
242, 262, 272: elastic part
242A: protruding portion
245: first hole
246: second hole
247, 248: fastening hole
249A, 249B: male screw
252: coupling part

What is claimed is:

1. An optical vibration-proof device comprising:
   a base member;
   a lens holding frame configured to be movable, along a planar surface orthogonal to an optical axis, in the planar surface with respect to the base member;
   a magnetic material that is moved integrally with the lens holding frame and generates a magnetic field;
   a magnetic sensor that detects a change in the magnetic field in accordance with movement of the lens holding frame; and
   a sensor attachment member that is fixed to the base member,
   wherein the base member includes a positioning part,
   the sensor attachment member brings the magnetic sensor into contact with the positioning part to position the magnetic sensor,
   the base member is formed integrally with a same member as the positioning part, and is formed as a separate member from the sensor attachment member, and
   the sensor attachment member has an elastic part, and biases the magnetic sensor by an elastic force generated in the elastic part to bring the magnetic sensor into contact with the positioning part.

2. The optical vibration-proof device according to claim 1,
   wherein the magnetic sensor is mounted on a print substrate, and
   the print substrate is fixed to the base member at a position between the lens holding frame and the base member.

3. The optical vibration-proof device according to claim 2, wherein the positioning part has an escape part that avoids physical interference with the print substrate in a case in which the magnetic sensor is brought into contact with the positioning part.

4. The optical vibration-proof device according to claim 2, wherein the print substrate is a flexible print substrate.

5. The optical vibration-proof device according to claim 1, wherein each of the sensor attachment member and the base member has a position regulation part capable of directly performing position regulation.

6. The optical vibration-proof device according to claim 5, wherein the base member has a first pin and a second pin, the sensor attachment member has a first hole and a second hole formed therein, and
the sensor attachment member is positioned on the base member by inserting the first hole and the second hole into the first pin and the second pin, respectively.

7. The optical vibration-proof device according to claim 1, wherein the sensor attachment member has a fastening hole into which a fastener is inserted formed therein, and
the sensor attachment member is fixed to the base member via the fastener that is inserted into the fastening hole and fixed to the base member.

8. The optical vibration-proof device according to claim 1, wherein the sensor attachment member also serves as a position regulation member that regulates a position of the magnetic sensor in an optical axis direction.

9. The optical vibration-proof device according to claim 2, wherein the sensor attachment member also serves as a fixing member that fixes the print substrate to the base member.

10. The optical vibration-proof device according to claim 1, wherein each of the base member and the sensor attachment member is a molded product made of a resin.

11. The optical vibration-proof device according to claim 1, wherein: the base member and the sensor attachment member are made of resins different from each other, and
the sensor attachment member is a molded product made of a resin having a higher molding fluidity than the base member, thereby the sensor attachment member having a lower modulus of elasticity than the base member.

12. The optical vibration-proof device according to claim 1, wherein the base member and the sensor attachment member are made of different materials.

13. The optical vibration-proof device according to claim 1, wherein the sensor attachment member is a material having a lower modulus of elasticity than the base member.

14. The optical vibration-proof device according to claim 1, wherein the base member and the sensor attachment member are made of materials having the same linear expansion coefficient.

15. The optical vibration-proof device according to claim 1, wherein the base member is a material having a higher stiffness than the sensor attachment member.

16. The optical vibration-proof device according to claim 1, wherein any one of the length to cross-sectional area ratios of the sensor attachment member is larger than any one of the length to cross-sectional area ratios of the base member.

17. The optical vibration-proof device according to claim 1, wherein the magnetic material is a magnet provided on the lens holding frame.

18. An optical device comprising:

the optical vibration-proof device according to claim 1.

19. A fixing method of a magnetic sensor in an optical vibration-proof device including a base member, a lens holding frame configured to be movable, along a planar surface a orthogonal to an optical axis, in the planar surface with respect to the base member, a magnetic material that is moved integrally with the lens holding frame and generates a magnetic field, a magnetic sensor that detects a change in the magnetic field in accordance with movement of the lens holding frame, a print substrate on which the magnetic sensor is mounted, and a sensor attachment member that is fixed to the base member, and moving the lens holding frame in the planar surface orthogonal to the optical axis, the method comprising:

disposing the print substrate on a surface of the base member facing the lens holding frame;

disposing the sensor attachment member on the base member with the print substrate interposed therebetween;

bringing the magnetic sensor into contact with a positioning part provided integrally with the base member as a same member in a case of fixing the sensor attachment member; and fixing the sensor attachment member to the base member in a state in which the magnetic sensor is brought into contact with the positioning part by an elastic part of the sensor attachment member biasing the magnetic sensor by an elastic force generated in the elastic part to bring the magnetic sensor into contact with the positioning part.

* * * * *